US010026746B2

(12) United States Patent
Lee et al.

(10) Patent No.: US 10,026,746 B2
(45) Date of Patent: Jul. 17, 2018

(54) MEMORY DEVICES USING ETCHING STOP LAYERS

(71) Applicants: Jeong Gil Lee, Hwaseong-si (KR); Jee Yong Kim, Hwaseong-si (KR); Jung Hwan Lee, Seoul (KR); Dae Seok Byeon, Seongnam-si (KR); Hyun Seok Lim, Suwon-si (KR)

(72) Inventors: Jeong Gil Lee, Hwaseong-si (KR); Jee Yong Kim, Hwaseong-si (KR); Jung Hwan Lee, Seoul (KR); Dae Seok Byeon, Seongnam-si (KR); Hyun Seok Lim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/604,028

(22) Filed: May 24, 2017

(65) Prior Publication Data

US 2018/0108664 A1    Apr. 19, 2018

(30) Foreign Application Priority Data

Oct. 14, 2016    (KR) .......................... 10-2016-0133448

(51) Int. Cl.
| | |
|---|---|
| *H01L 27/115* | (2017.01) |
| *H01L 27/1157* | (2017.01) |
| *H01L 27/11524* | (2017.01) |
| *H01L 23/535* | (2006.01) |
| *H01L 29/06* | (2006.01) |
| *H01L 29/788* | (2006.01) |
| *H01L 29/792* | (2006.01) |
| *H01L 29/423* | (2006.01) |
| *G11C 16/10* | (2006.01) |

(Continued)

(52) U.S. Cl.
CPC .......... *H01L 27/1157* (2013.01); *G11C 16/08* (2013.01); *G11C 16/10* (2013.01); *G11C 16/26* (2013.01); *H01L 23/535* (2013.01); *H01L 27/11524* (2013.01); *H01L 29/0649* (2013.01); *H01L 29/42328* (2013.01); *H01L 29/42344* (2013.01); *H01L 29/788* (2013.01); *H01L 29/792* (2013.01)

(58) Field of Classification Search
CPC ........... H01L 27/115–27/11582; H01L 29/788; H01L 29/792; H01L 29/7923; H01L 29/7926; H01L 29/66833
See application file for complete search history.

(56) References Cited

U.S. PATENT DOCUMENTS 7,927,926 B2    4/2011    Katsumata et al.
7,989,880 B2 *  8/2011    Wada ................ H01L 21/76808
                                                                257/314

(Continued)

FOREIGN PATENT DOCUMENTS

KR    1020160024592 A    3/2016

*Primary Examiner* — Victoria K Hall
(74) *Attorney, Agent, or Firm* — Myers Bigel, P.A.

(57) ABSTRACT

A memory device may include a gate structure including a plurality of gate electrode layers and a plurality of insulating layers alternately stacked on a substrate, a plurality of etching stop layers, extending from the insulating layers respectively, being on respective lower portions of the gate electrode layers; and a plurality of contacts connected to the gate electrode layers above upper portions of the etching stop layers, respectively, wherein respective ones of the etching stop layers include an air gap therein.

20 Claims, 24 Drawing Sheets

(51) Int. Cl.
*G11C 16/26* (2006.01)
*G11C 16/08* (2006.01)

(56) References Cited

U.S. PATENT DOCUMENTS

| | | | |
|---|---|---|---|
| 9,184,177 B2 | 11/2015 | Imamura et al. | |
| 9,893,074 B2* | 2/2018 | Lee | H01L 27/11556 |
| 2007/0252201 A1* | 11/2007 | Kito | H01L 21/8221 |
| | | | 257/331 |
| 2010/0207240 A1* | 8/2010 | Hashimoto | H01L 27/11578 |
| | | | 257/532 |
| 2012/0070944 A1* | 3/2012 | Kim | H01L 27/0688 |
| | | | 438/128 |
| 2012/0171861 A1* | 7/2012 | Park | H01L 21/31144 |
| | | | 438/639 |
| 2013/0062683 A1* | 3/2013 | Fukuzumi | H01L 29/66833 |
| | | | 257/324 |
| 2015/0243675 A1* | 8/2015 | Lim | H01L 27/11556 |
| | | | 257/324 |
| 2015/0255484 A1* | 9/2015 | Imamura | H01L 27/11582 |
| | | | 257/314 |
| 2015/0340374 A1* | 11/2015 | Jung | H01L 27/11573 |
| | | | 438/258 |
| 2016/0079069 A1* | 3/2016 | Uenaka | H01L 27/11582 |
| | | | 257/326 |
| 2016/0293625 A1* | 10/2016 | Kang | H01L 27/11582 |
| 2017/0069637 A1* | 3/2017 | Son | H01L 27/1157 |
| 2017/0148677 A1* | 5/2017 | Shin | H01L 21/76816 |
| 2017/0154785 A1* | 6/2017 | Yoshimizu | C23F 1/16 |
| 2017/0194255 A1* | 7/2017 | Oh | H01L 21/76816 |
| 2017/0309486 A1* | 10/2017 | Jung | H01L 27/11573 |
| 2017/0309635 A1* | 10/2017 | Kim | H01L 27/11582 |
| 2017/0323900 A1* | 11/2017 | Kanamori | H01L 27/11582 |
| 2017/0358594 A1* | 12/2017 | Lu | H01L 27/11582 |
| 2017/0365613 A1* | 12/2017 | Gunji-Yoneoka | H01L 27/11556 |
| 2017/0373078 A1* | 12/2017 | Chu | H01L 27/11556 |
| 2017/0373079 A1* | 12/2017 | Sharangpani | H01L 27/11556 |
| 2017/0373087 A1* | 12/2017 | Ito | H01L 27/11582 |

\* cited by examiner

MEMORY DEVICES USING ETCHING STOP LAYERS

CROSS-REFERENCE TO RELATED APPLICATION

This U.S. non-provisional patent application claims benefit of priority under 35 U.S.C. § 119 to Korean Patent Application No. 10-2016-0133448, filed on Oct. 14, 2016, in the Korean Intellectual Property Office, the entire content of which is incorporated herein by reference.

BACKGROUND

1. Field

The present inventive concept relates to memory devices.

2. Description of Related Art

Electronic devices have gradually become smaller, while still being required to process large amounts of data. Accordingly, a degree of integration of semiconductor memory devices used in such electronic devices has also increased. To provide an increased degree of integration in semiconductor memory devices, some semiconductor memory devices have been provided with a vertical transistor structure, instead of a planar transistor structure.

SUMMARY

Embodiments of the present inventive concepts may provide memory devices able to secure improved reliability while increasing a degree of integration.

According to an aspect of embodiments of the present inventive concepts, a memory device may include a gate structure including a plurality of gate electrode layers and a plurality of insulating layers alternately stacked on a substrate, a plurality of etching stop layers, extending from the insulating layers respectively, being on respective lower portions of the gate electrode layers, and a plurality of contacts connected to the gate electrode layers above upper portions of the etching stop layers, respectively. Respective ones of the etching stop layers may include an air gap therein.

According to an aspect of embodiments of the present inventive concepts, a memory device may include a plurality of gate electrode layers having pad regions connected to respective ones of a plurality of contacts, and a plurality of gate isolating layers alternately stacked with the gate electrode layers, and including a first region and a second region formed of different materials, respectively. The second region of respective ones of the gate isolating layers may be on a lower portion of the pad region of respective ones of the gate electrode layers, and may include a plurality of layers formed of different materials.

According to an aspect of embodiments of the present inventive concepts, a memory device may include a substrate, a gate electrode layer on the substrate and extending in a first direction substantially parallel to an upper surface of the substrate, a contact on the gate electrode layer and extending in a second direction crossing the first direction, an insulating layer adjacent the gate electrode layer and between the gate electrode layer and the substrate, and an etching stop layer adjacent the insulating layer and between the contact and the substrate. The contact may penetrate into at least a portion of the gate electrode layer. The etching stop layer may include an upper segment and a lower segment, where the upper segment is adjacent the gate electrode layer, and the lower segment is separated from the upper segment in the second direction.

BRIEF DESCRIPTION OF DRAWINGS

The above, and other aspects, features, and advantages of the present inventive concepts will be more clearly understood from the following detailed description when taken in conjunction with the accompanying drawings, in which.

DETAILED DESCRIPTION

Figure 1:
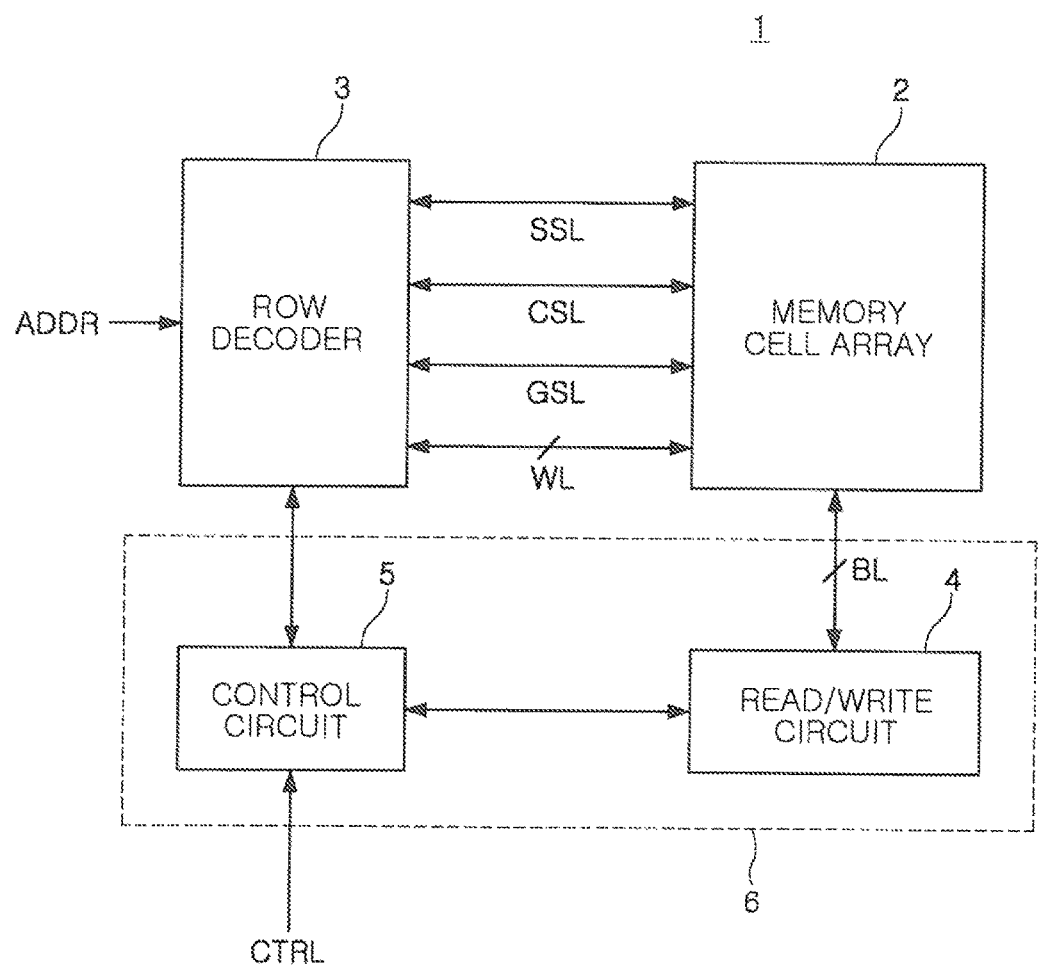
FIG. 1 illustrates a schematic block diagram of a memory device according to an example embodiment of the present inventive concepts.

Referring to FIG. 1, a memory device 1 according to an example embodiment of the present inventive concepts may include a memory cell array 2, a row decoder 3, and a core logic circuit 6. The core logic circuit 6 may include a read/write circuit 4 and a control circuit 5.

The memory cell array 2 may include a plurality of memory cells arranged in a plurality of rows and a plurality of columns. The memory cells included in the memory cell array 2 may be connected to the row decoder 3 through a word line WL, a common source line CSL, a string select line SSL, and/or a ground select line GSL, and may be connected to the read/write circuit 4 through a bit line BL. In an example embodiment, a plurality of memory cells arranged in a single row may be connected to a single word line WL, and a plurality of memory cells arranged in a single column may be connected to a single bit line BL.

The memory cells included in the memory cell array 2 may be divided into a plurality of memory blocks. Each of the memory blocks may include a plurality of word lines WLs, a plurality of string select lines SSLs, a plurality of ground select lines GSLs, a plurality of bit lines BLs, and/or at least one common source line CSL.

The row decoder 3 may receive address ADDR information from an external source, and may decode tire received ADDR information to determine a level of voltage supplied to at least a portion of tire word line WL, the common source line CSL, the string select line SSL, and/or the ground select line GSL connected to the memory cell array 2.

The read/write circuit 4 may select at least a portion of the bit lines BL connected to the memory cell array 2 according to an instruction received from the control circuit 5. The read/write circuit 4 may read data stored in a memory cell connected to the selected at least a portion of the bit lines BLs, or may write data to the memory cell connected to the selected at least a portion of the bit lines BLs. The read/write circuit 4 may include circuits such as, for example, a page buffer, an input output (I/O) buffer, and/or a data latch to perform the above operations.

The control circuit 5 may control operations of the row decoder 3 and the read/write circuit 4 in response to a control signal CTRL transmitted from an external source. In the case of reading data from the memory cell array 2, the control circuit 5 may control operations of the row decoder 3 to supply a voltage for a data reading operation to a word line WL in which the data to be read is stored. When a voltage for a data reading operation is supplied to a certain word line WL, the control circuit 5 may control the read/write circuit 4 to read data stored in a memory cell connected to the certain word line WL.

Meanwhile, when data is written to the memory cell array 2, the control circuit 5 may control the row decoder 3 to supply a voltage for a data writing operation to a word fine WL to which data is to be written. When a voltage for a data writing operation is supplied to a certain word line WL, the control circuit 5 may control the read/write circuit 4 to write data to a memory cell connected to the word line WL to which the voltage for a data writing operation is supplied.

Figure 2:
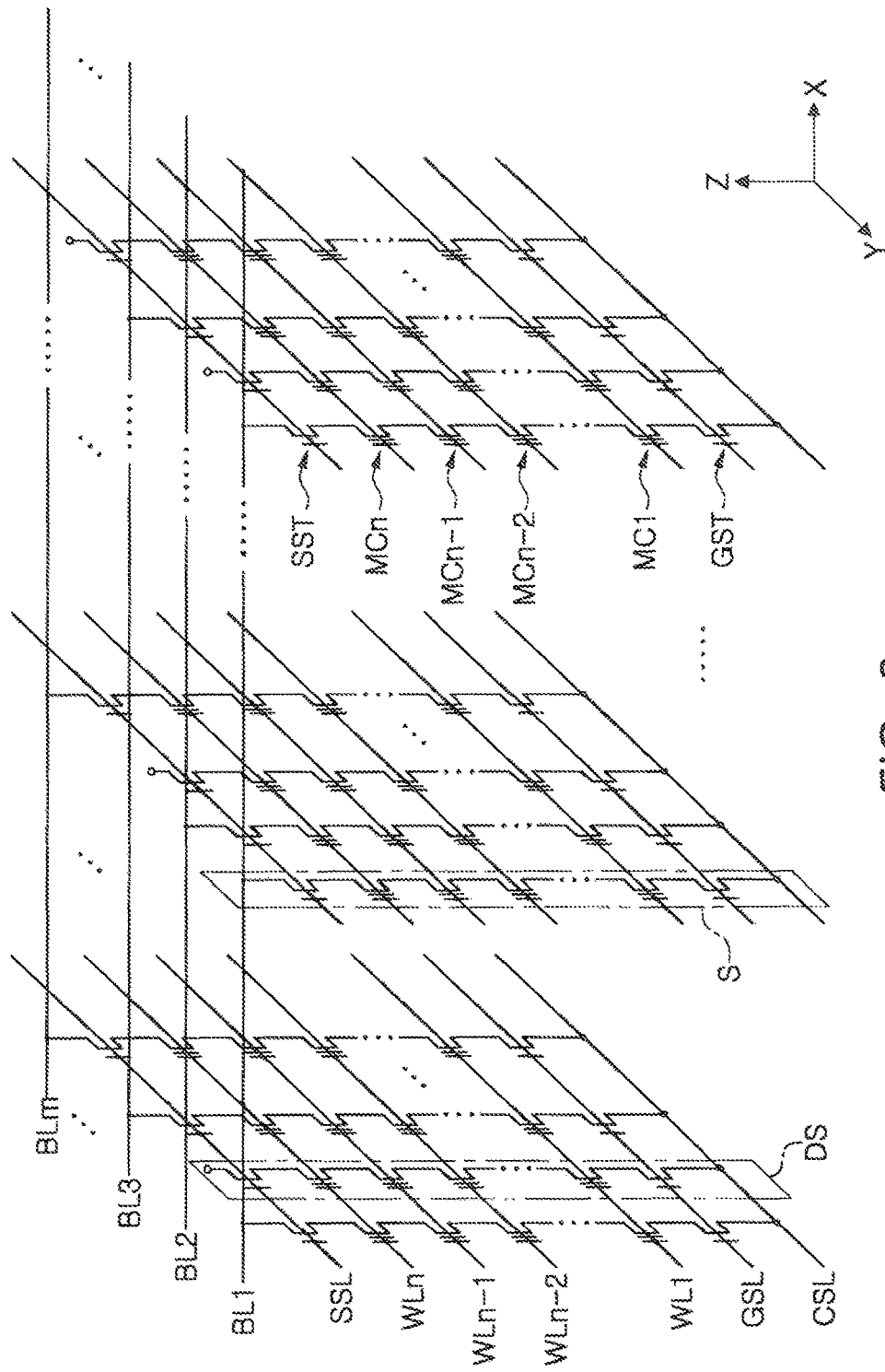
FIG. 2 illustrates an equivalent circuit diagram of a memory cell array of a memory device according to an example embodiment of the present inventive concepts.

FIG. 2 is an equivalent circuit diagram of a memory cell array of a memory device according to an example embodiment of the present inventive concepts. A memory device, according to an example embodiment, may be a vertical NAND flash element.

Referring to FIG. 2, the memory cell array 2 may include a plurality of memory cell strings S, each of the memory cell strings S including n memory cells MC1 to MCn, connected to each other in series, and a ground select transistor GST and a string select transistor SST connected to both ends of the n memory cells MC1 to MCn in series. The n memory cells MC1 to MCn, connected to each, other in series, may be connected to n word lines WL1 to WLn for selecting the memory cells MC1 to MCn, respectively. In some embodiments, a dummy cell may further be disposed between the ground select transistor GST and the first memory cell MC1, and/or between the string select transistor SST and the n-th memory cell MCn.

A gate terminal of the ground select transistor GST may be connected to a ground select line GSL, and a source terminal of the ground select transistor GST may be connected to a common source line CSL. Meanwhile, a gate terminal of the string select transistor SST may be connected to a string select line SSL, and a source terminal of the string select transistor SST may be connected to a drain terminal of the memory cell MCn. FIG. 2 illustrates a structure in which a single ground select transistor GST and a single string select transistor SST may be connected to the n memory cells MC1 to MCn, connected to each other in series. In some embodiments, a plurality of ground select transistors GST or a plurality of string select transistors SST may also be connected to then memory cells MC1 to MCn.

A drain terminal of the string select transistor SST may be connected to a plurality of bit lines BL1 to BLm. When a signal is applied to the gate terminal of the string select transistor SST through the string select line SSL, the signal applied through the bit lines BL1 to BLm may be transmitted to the n memory cells MC1 to MCn, connected to each other in series, and a data reading/writing operation may thus be performed. Further, a data erase operation of erasing data stored in the n memory cells MC1 to MCn may be performed by applying an erase voltage having a certain level to the n memory cells MC1 to MCn through a well region formed in a substrate.

Referring to FIG. 2, a memory device according to an example embodiment of the present inventive concepts may include at least one dummy string DS. The at least one dummy string DS may include a dummy channel electrically separated from the bit lines BL1 to BLm.

Figure 3:
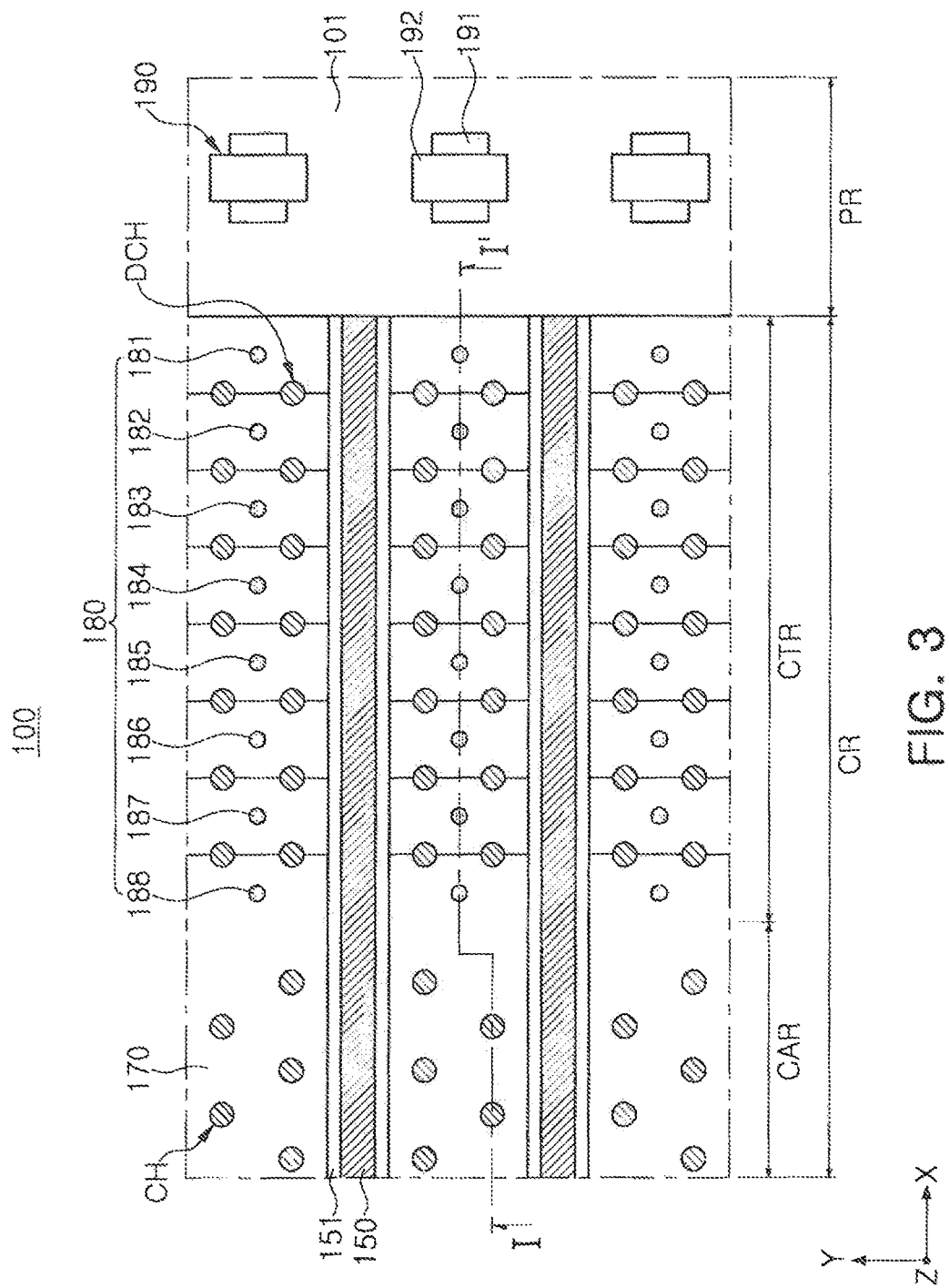
FIG. 3 illustrates a schematic plan view of a memory device according to an example embodiment of the present inventive concepts.

FIG. 3 illustrates a schematic plan view of a memory device according to an example embodiment of the present inventive concepts.

Referring to FIG. 3, a memory device 100 according to an example embodiment may include a cell region CR and a peripheral circuit region PR adjacent thereto. In some embodiments, the memory device 100 may be an embodiment, or a portion of an embodiment, of the memory device 1 illustrated in FIG. 1. The cell region CR may include a gate structure in which a plurality of gate electrode layers and a plurality of gate isolating layers are alternately stacked on an upper surface of a substrate 101, a plurality of channel structures CHs and DCHs extending in a direction perpendicular to the upper surface of the substrate 101 to pass through the gate structure, and a plurality of first to eighth contacts 181 to 188 (collectively represented by a contact 180) connected to the gate electrode layers. The peripheral circuit region PR may include a peripheral circuit device 190 formed on the substrate 101. The peripheral circuit device 190 may be a planar transistor, and may include an active region 191 and a planar gate electrode 192.

In an example embodiment illustrated in FIG. 3, the upper surface of the substrate 101 may be disposed on an X-Y plane, and the channel structures CHs and DCHs and the contact 180 may extend in the direction perpendicular to the upper surface of the substrate 101, for example, a Z-axis direction of FIG. 3. The gate electrode layers connected to the contact 180 may be alternately stacked with the gate isolating layers in the Z-axis direction on the upper surface of the substrate 101 disposed on the X-Y plane. In some embodiments, an interlayer insulating layer 170 may be on the gate electrode layers.

The channel structures CHs and DCHs may include a plurality of channel structures CHs and a plurality of dummy channel structures DCHs. The channel structures CHs and the dummy channel structures DCHs may have substantially the same or different internal structures. The dummy channel structures DCHs need not be connected to a bit line thereon, unlike the channel structures CHs, and thus, in the dummy channel structures DCHs, a data recording or data erasing operation may not be performed. The dummy channel structures DCHs may be disposed adjacent to an edge of each of the gate electrode layers to support the gate electrode layers, so that the gate electrode layers may not collapse or be bent during a process.

The channel structures CHs may be spaced apart from each other on the X-Y plane. The number and an arrangement of the channel structures CHs may vary according to example embodiments, and for example, the channel structures CHs may also be disposed in zigzag form, as illustrated in FIG. 3. Also, the arrangement of the channel structures CHs adjacent to each other with isolation insulating layers 151 interposed therebetween may be symmetrical, as illustrated in FIG. 3, but the present inventive concepts are not limited thereto.

The gate electrode layers, the channel structures CHs, and the like may be divided into a plurality of regions by a common source line 150 and the isolation insulating layers 131 disposed on lateral surfaces of the common source line 150. Each of the regions defined by the common source line 150 and the isolation insulating layers 151 may be provided as a plane or a block of the memory device 100. The common source line 150 may be connected to a source region, formed by doping a portion of the substrate 101 with impurities, therebelow in the Z-axis direction.

The gate electrode layers may provide a pad region extending to have different lengths in a first direction, for example, an X-axis direction of FIG. 3, and having a step. In some embodiments, the pad region may be a region of the gate electrode layer that is below a contact. In the pad region, the gate electrode layers may have a stepped shape having a step, and may be connected to the contact 180 (see FIG. 4). For example, the pad region may be provided as a contact region CTR in which the contact 180 is connected to the gate electrode layers, and the cell region CR may include a cell array region CAR and the contact region CTR.

Figure 4:
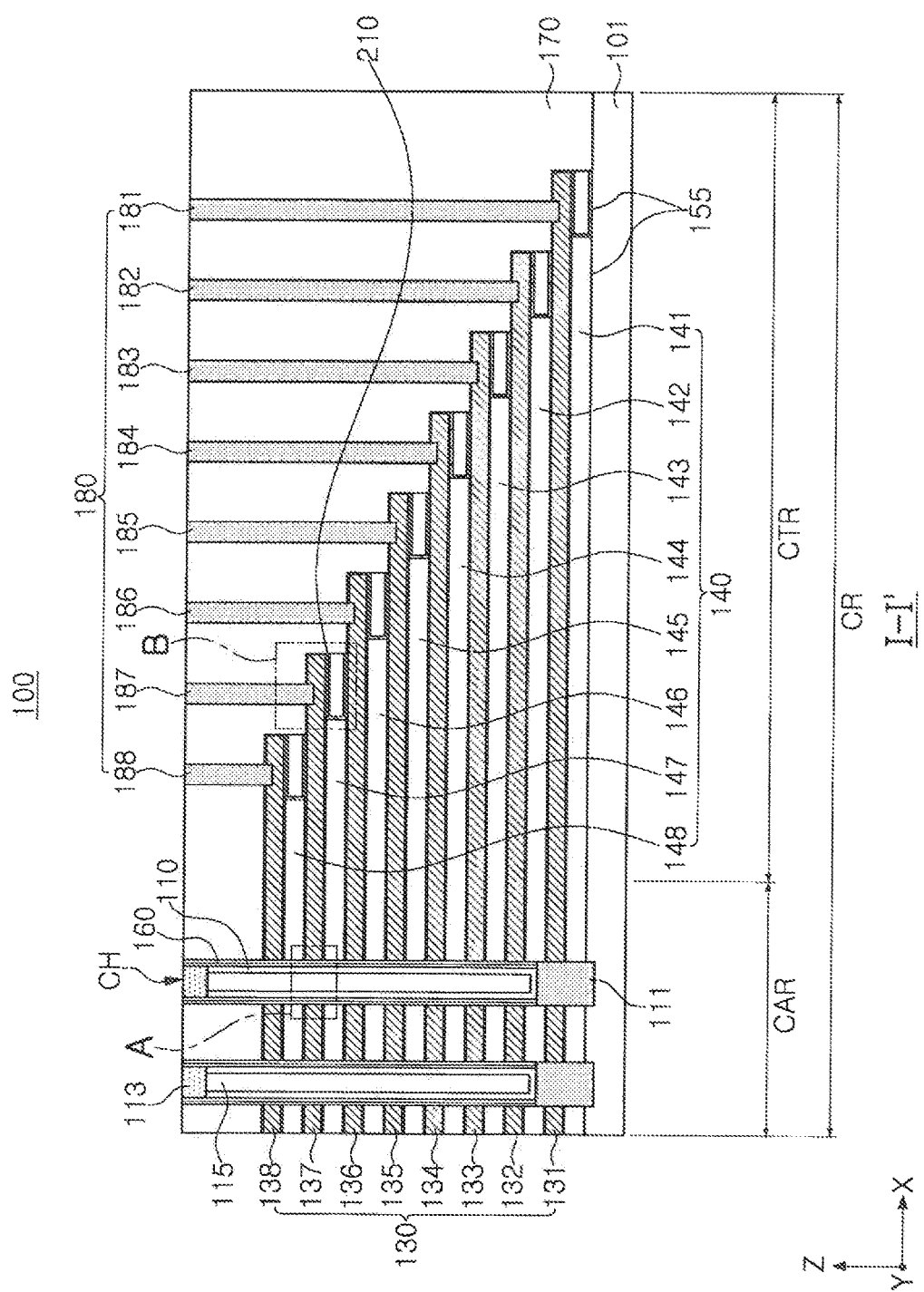
FIG. 4 illustrates a cross-sectional view taken along line I-I' of FIG. 3.

FIG. 4 illustrates a cross-sectional view taken along line I-I' of FIG. 3.

Referring to FIG. 4, the memory device 100 according to an example embodiment of the present inventive concepts may include the substrate 101, a plurality of first to eighth gate electrode layers 131 to 138 (collectively represented by a gate electrode layer 130) alternately stacked on the upper surface of the substrate 101, a plurality of first to eighth insulating layers 141 to 148 (collectively represented by an insulating layer 140), and etching stop layers 210 each disposed on a lower portion of the pad region of the gate electrode layer 130. The etching stop layer 210 may be disposed on the lower portion of the pad region of the gate electrode layer 130 in which the gate electrode layer 130 and the contact 180 are connected to each other. The etching stop layer 210 may foe disposed on one lateral surface of the insulating layer 140 to form the gate isolating layers 155 together with the insulating layer 140, and the first to eighth gate electrode layers 131 to 138 and the gate isolating layers 155 may be alternately stacked to form the gate structure. As used herein, the lateral surface of an element may be a surface that extends in a direction (e.g., a Z direction) crossing a plane of the substrate 101 (e.g., an X-Y plane). In some embodiments, the gate isolating layers 155 may be formed of a insulating layer 140 and an etching stop layer 210 which are adjacent one another at a same level between adjacent ones of the gate electrode layers 130.

The first to eighth gate electrode layers 131 to 138 may be paired with the gate isolating layers 155 adjacent thereto in a stacking direction, for example, the Z-axis direction, and each of the pairs may extend in the first direction, for example, the X-axis direction, to have a different length. Referring to FIG. 4, the pair extending to have the different length may provide a pad region, and the contact 180 may be connected to the gate electrode layer 130 in the pad region.

An interlayer insulating layer 170 formed of an insulating material such as a silicon oxide may be provided on the gate electrode layer 130. The channel structure CHs, the dummy channel structures DCHs, and the contact 180 may pass through the interlayer insulating layer 170.

The channel structures CHs may extend to the upper surface of the substrate 101 through the gate electrode layer 130 and the insulating layers 140. In an example embodiment, the channel structures CHs may also penetrate into at least a portion of the substrate 101 therebelow. Each of the channel structures CHs may include a channel layer 110, an epitaxial layer 111, a bit line pad 113, a filling insulating layer 115, and a gate insulating layer 160. The gate insulating layer 160 may be disposed between the channel layer 110 and the gate electrode layer 130, and may include a plurality of layers. The channel structure CH will hereinafter be described with reference to FIG. 5.

Figure 5:
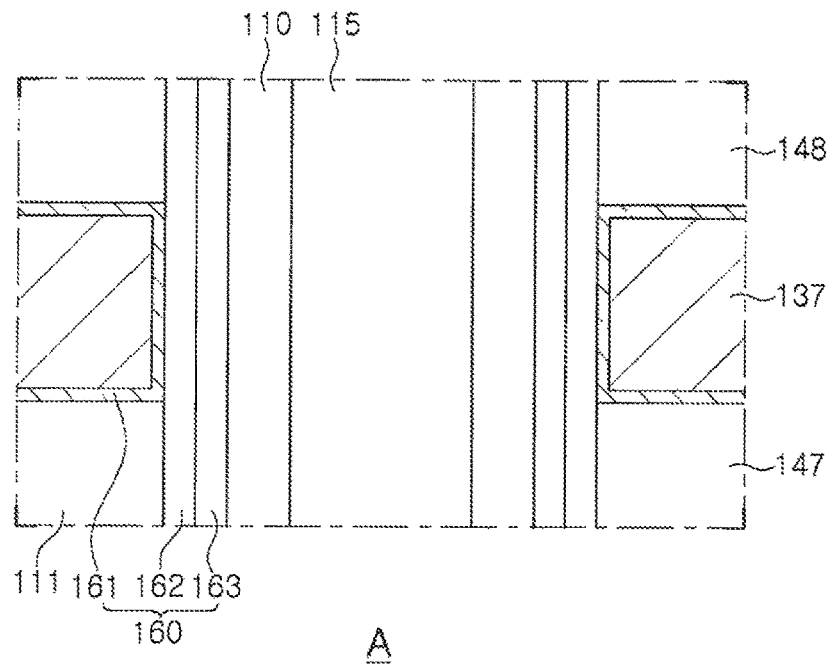
FIG. 5 illustrates an enlarged view of region A illustrated in FIG. 4.

FIG. 5 illustrates an enlarged view of region A illustrated in FIG. 4. Referring to FIG. 5, the channel structure CH may include the filling insulating layer 115, the channel layer 110 disposed on an outer surface of the filling insulating layer 115, and the gate insulating layer 160. The channel layer 110 may be formed in a cavity having a circular cross section, and may have an annular shape having a hollow interior, though the present inventive concepts are not limited thereto. A space formed in the center of the channel layer 110 may be filled with the filling insulating layer 115, and the channel layer 110 may have the bit line pad 113 formed thereon. (See FIG. 4.) The bit line pad 113 may be connected to a bit line to be provided as a drain region of a plurality of memory cell devices formed in the cell array region CAR.

The channel layer 110 and the gate electrode layer 130 may have the gate insulating layer 160 disposed therebetween, and the gate insulating layer 160 may include a blocking layer 161, a charge storage layer 162, and a tunneling layer 163. The blocking layer 161 may enclose the gate electrode layer 130, and depending on a structure of the memory device 100, may be disposed adjacent the charge storage layer 162 of the channel structure CH.

The blocking layer 161 may include, for example, a silicon oxide ($SiO_2$), a silicon nitride ($Si_3N_4$), a silicon oxynitride (SiON), and/or a high-k dielectric material. The high-k dielectric material may include, for example, one of an aluminum oxide ($Al_2O_3$), a tantalum oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$). The term "high-dielectric constant" may be defined as having a meaning in which a dielectric constant of the blocking layer 161 is higher than that of the tunneling layer 163 or a silicon oxide.

In some embodiments, the blocking layer 161 may selectively include a plurality of layers having different dielectric constants. In some embodiments, a layer having a relatively low dielectric constant among the layers may be disposed closer to the channel layer 110 than to a layer having a relatively high dielectric constant, so that an energy gap such as a barrier height may be controlled, thereby improving the characteristics of the memory device 100 such as, for example, erase features. In some embodiments, when the blocking layer 161 has a plurality of layers, at least one thereof may be disposed in the channel structure CH along an outer surface of the charge storage layer 162, and other layers of the plurality of layers of the blocking layer 161 may partially or fully surround the gate electrode layer 130.

The charge storage layer 162 may be a charge trapping layer or a conductive floating gate layer. When the charge storage layer 162 is a conductive floating gate layer, the charge storage layer 162 may be formed by depositing polycrystalline silicon, using a low pressure chemical vapor deposition (LPCVD) process. When the charge storage layer 162 is a charge trapping layer, the charge storage layer 162 may include, for example, at least one of a silicon oxide ($SiO_2$), a silicon nitride ($Si_3N_4$), a silicon oxynitride (SiON), a hafnium oxide ($HfO_2$), a zirconium oxide ($ZrO_2$), a tantalum oxide ($Ta_2O_5$), a titanium oxide ($TiO_2$), a hafnium aluminum oxide ($HfAl_xO_y$), a hafnium tantalum oxide (HfTa$_x$O$_y$), a hafnium silicon oxide (HfSi$_x$O$_y$), an aluminum nitride (Al$_x$N$_y$), and/or an aluminum gallium nitride (AlGa$_x$N$_y$).

The tunneling layer 163 may include, for example, at least one of a silicon oxide (SiO$_2$), a silicon nitride (Si$_3$N$_4$), a silicon oxynitride (SiON), a hafnium oxide (HfO$_2$), a hafnium silicon oxide (HfSi$_x$O$_y$), an aluminum oxide (Al$_2$O$_3$), and/or a zirconium oxide (ZrO$_2$).

To increase a capacity of the memory device 100, a plurality of first to eighth gate electrode layers 131 to 138 collectively represented by a gate electrode layer 130 and gate isolating layers 155 may be stacked. In some embodiments, when a thickness of one of the stacked gate electrode layer 130 and gate isolating layers 155 is not properly limited, a total thickness of a gate structure including the gate electrode layer 130 and the gate Isolating layers 155 may be excessively increased. When the total thickness of the gate structure is increased, a level of difficulty of a process of forming the channel structures CHs and DCHs and the contact 180 may be increased.

To lower the level of difficulty, when the thickness of each of the gate electrode layer 130 and the gate isolating layers 155 is reduced, a portion of the contact 180 may pass through the gate electrode layer 130 to be connected to other gate electrode layer 130, causing short circuits. In addition, when the thickness of each of the gate electrode layer 130 and the gate isolating layers 155 is reduced, a level of breakdown voltage of the gate electrode layer 130 may be lowered. If the level of breakdown voltage is lowered, when a voltage is applied to the gate electrode layer 130 through the contact 180, metal atoms included in the gate electrode layer 130 may diffuse into another gate electrode layer 130, and thus, portions of the gate electrode layer 130 may be electrically connected to each other.

In some embodiments, the etching stop layer 210 may be disposed on the lower portion of the pad region in which the contact 180 is connected to the gate electrode layer 130, thereby resolving the above issue. The etching stop layer 210 may have an air gap or at least one filling layer formed therein. In an example embodiment, the etching stop layer 210 may have an air gap and at least one filling layer formed therein. A configuration of the etching stop layer 210 will hereinafter be described in detail with reference to FIGS. 6 through 10.

FIGS. 6 through 10 are enlarged views illustrating various examples of region B illustrated in FIG. 4.

Figure 6:
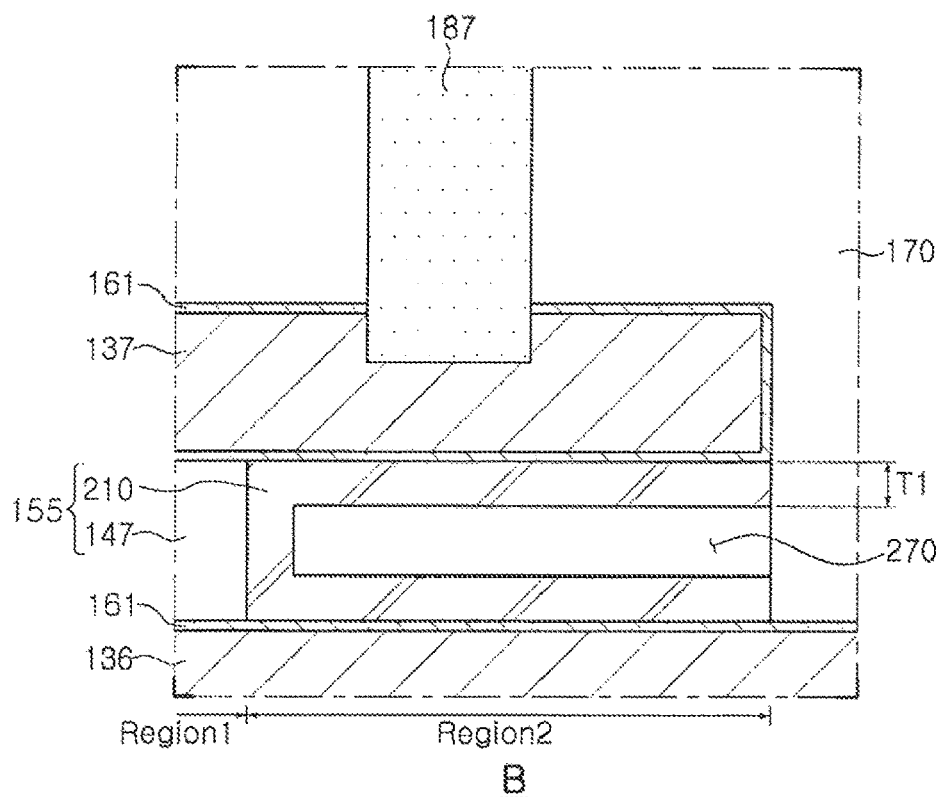
FIGS. 6 through 10 are enlarged views illustrating various examples of region B illustrated in FIG. 4.

Because the various examples of region B of FIG. 4, illustrated in FIGS. 6 through 10, may be similar, the example of FIG. 6 will be mainly described in detail, the portions of FIGS. 7 through 10 that are the same or similar to those of FIG. 6 will be omitted, and differences between the examples of FIGS. 6 through 10 will mainly be described.

Referring to FIG. 6, the seventh insulating layer 147 may be disposed in Region 1 of the gate isolating layer 155, and the etching stop layer 210 having an air gap 270 may be disposed in Region 2 thereof. In an example embodiment illustrated in FIG. 6, Region 2, provided on a lateral surface of the seventh insulating layer 147, may correspond to a lower portion of a pad region in which the seventh contact 187 may be connected to the seventh gate electrode layer 137.

The etching stop layer 210 may be disposed on the lower portion of the pad region of the gate electrode layer 130, and may be formed on a lateral surface of the insulating layer 140. As an example, the etching stop layer 210 may have a lateral surface contacting a lateral surface of the seventh insulating layer 147, and an upper surface and a lower surface extending from the lateral surface of the seventh insulating layer 147 to be parallel to the seventh gate electrode layer 137. The upper surface and the lower surface of the etching stop layer 210 may form segments of the etching stop layer 210 that are separated from one another with a gap in between.

Region 1 and Region 2 of the gate isolating layer 155 may be formed of different materials. As an example, the seventh insulating layer 147 disposed in Region 1 of the gate isolating layer 155 may include a silicon oxide layer and/or a silicon nitride layer, and the etching stop layer 210 disposed in Region 2 may include a silicon carbon nitride (SiCN) layer and/or a silicon oxynitride (SiON) layer. The etching stop layer 210 may prevent or inhibit the contact 180 from passing through the gate electrode layer 130. In some embodiments, the contact 180 may pass through the gate electrode layer 130 to contact a portion of the etching stop layer 210. The air gap 270 may be formed between the upper and lower surfaces of the etching stop layer 210 (e.g. between opposing segments of the etching stop layer 210) to prevent or reduce metal atoms included in a first gate electrode layer 130 from diffusing into a second gate electrode layer 130, due to a voltage applied to the first gate electrode layer 130 through the contact 180.

Referring to FIGS. 7 through 10, Region 2 of the gate isolating layer may include at least one filling layer formed of a different material from the etching stop layer 210, and the filling layer may have a plurality of layers formed of different materials. In some embodiments, an air gap may also be formed in the filling layer.

Figure 7:
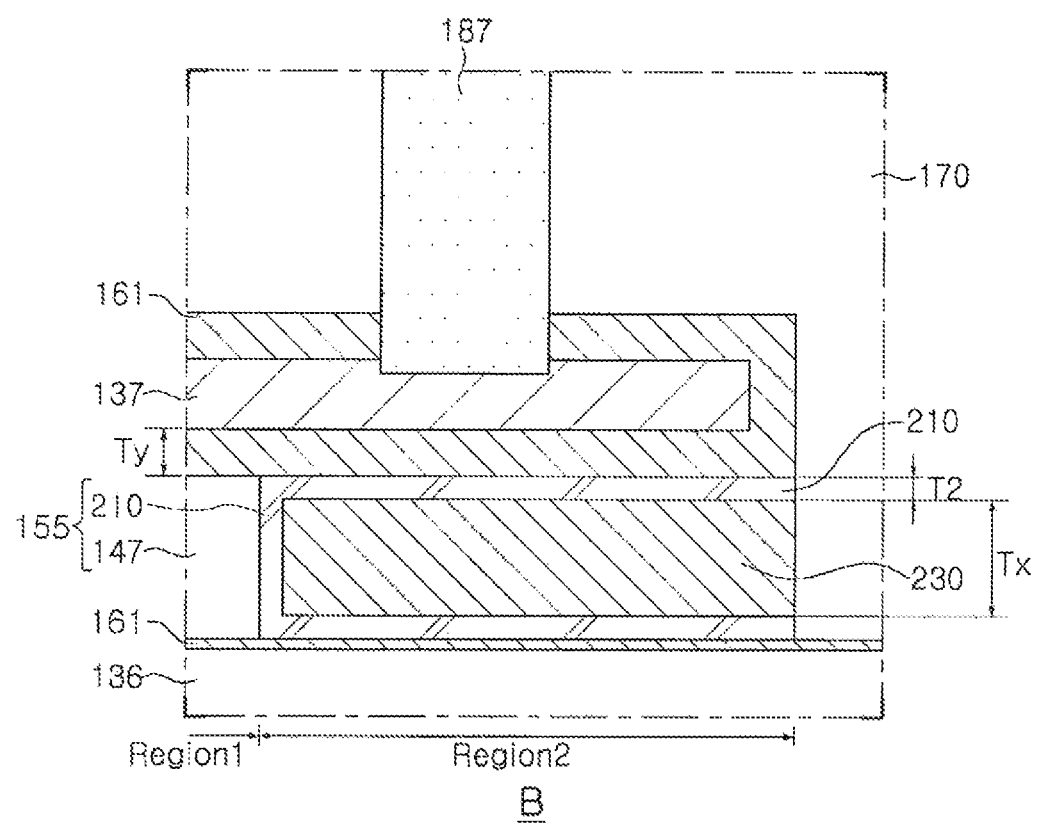
Figure 8:
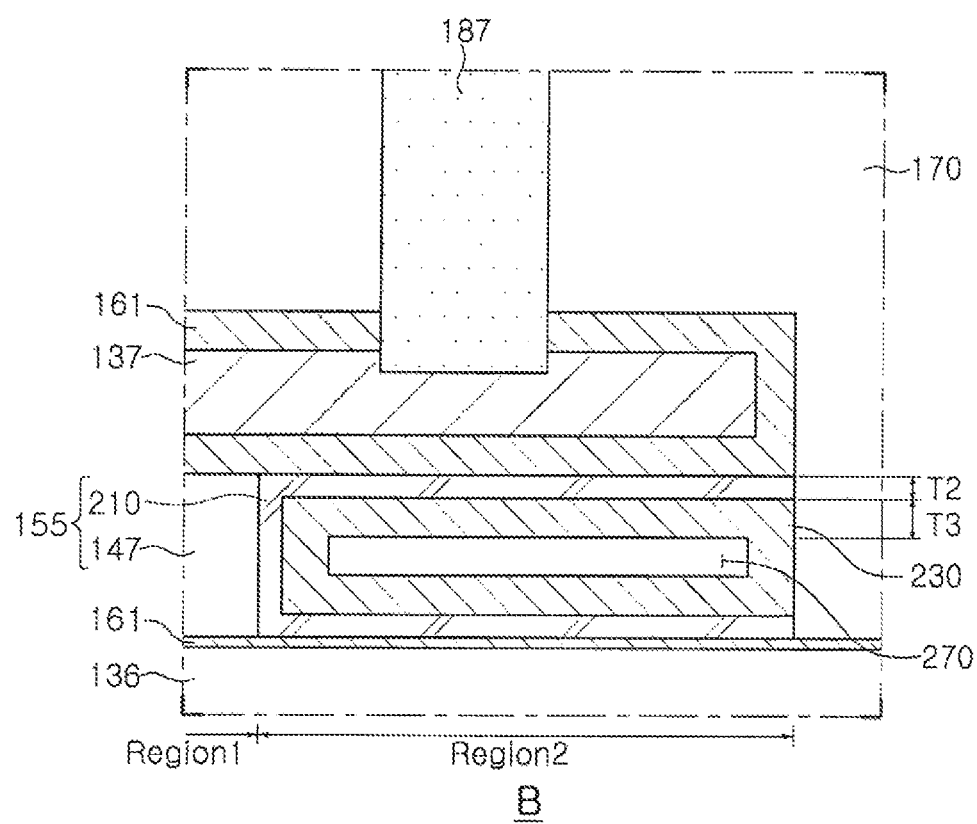

Referring to FIGS. 7 and 8, a first filling layer 230 may be formed inside the etching stop layer 210 disposed in Region 2 of the gate isolating layer 155. As an example, the first filling layer 230 may be formed of a high-k dielectric material. In an example embodiment illustrated in FIG. 7, the first filling layer 230 may be disposed between opposing segments of the etching slop layer 210, and may be in or completely fill an internal space of the etching stop layer 210. In some embodiments, the first filling layer 230 may be formed such that an air gap may not be formed between the opposing segments of the etching stop layer 210. In some embodiments, such as the example embodiment illustrated in FIG. 8, the first filling layer 230 may be formed along inner surfaces of a space formed by the etching stop layer 210 and the interlayer insulating layer 170, and the air gap 270 may be formed inside the first filling layer 230. In other words, as illustrated in FIG. 8, the first filling layer 230 may be conformally formed on the opposing segments of the upper and lower surfaces of the etching stop layer 210 and on lateral portions of the etching stop layer 210 and the interlayer insulating layer 170 so as to form the air gap 270.

Figure 9:
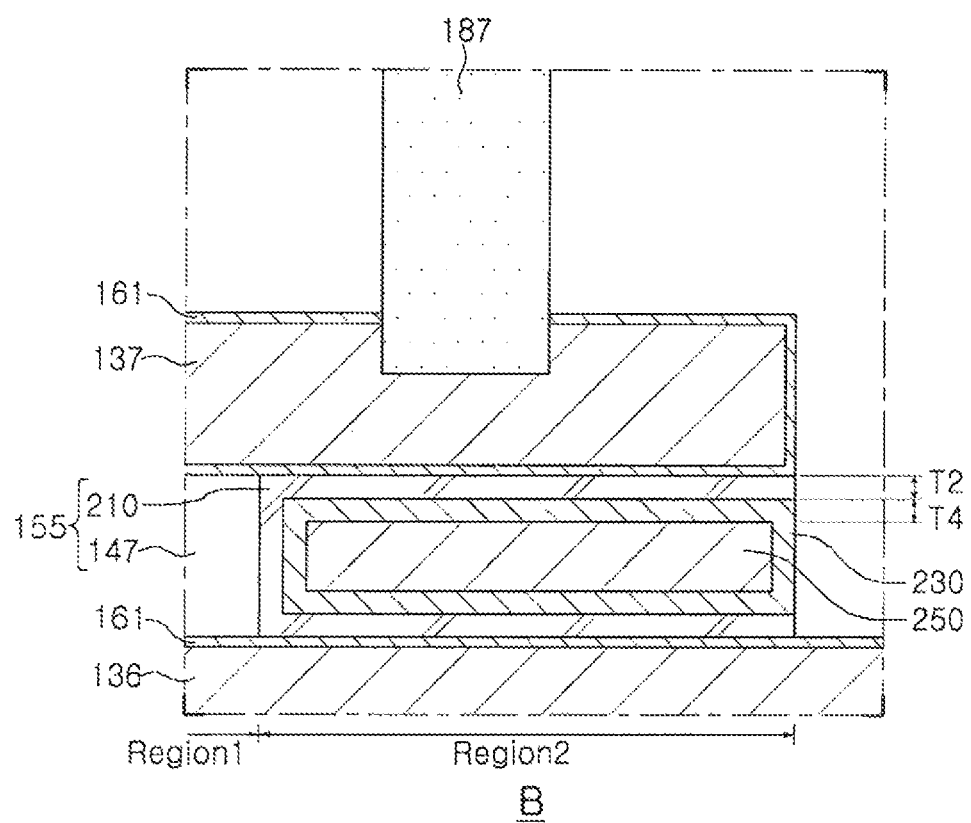

In an example embodiment illustrated in FIG. 9, a second filling layer 250 may be formed inside the first filling layer 230. In some embodiments, the second filling layer 250 may be formed of a different material from the first filling layer 230, for example, a conductive material, such as a metal, polycrystalline silicon, and/or a metal silicide material. In the example embodiment illustrated in FIG. 9, the second filling layer 250 may be disposed inside the first filling layer 230 to be within or completely fill an internal space of the first filling layer 230. In an example embodiment illustrated in FIG. 10, the second filling layer 250 may be formed along inner surfaces of a space formed by the first filling layer 230, and the air gap 270 may be formed inside the second filling layer 250.

As described below, the etching stop layer 210 having the air gap 270 may be formed in Region 2 of the gate isolating layer 155, and then the first and/or second filling layers 230 and 250 may be formed of a high-k dielectric material and a conductive material. In some embodiments, whether to form the first filling layer 230, the second filling layer 250, and/or the air gap 270 may be determined based on a thickness of the formed etching stop layer 210 and amounts of the high-k dielectric material and the conductive material.

Referring to FIG. 6, when a thickness T1 of a deposited etching stop layer 210 is relatively large, a high-k dielectric material may not flow into the air gap 270, and thus, the etching stop layer 210 having the air gap 270, but not the first filling layer 230 or the second filling layer 250, therein may be formed.

Figure 10:
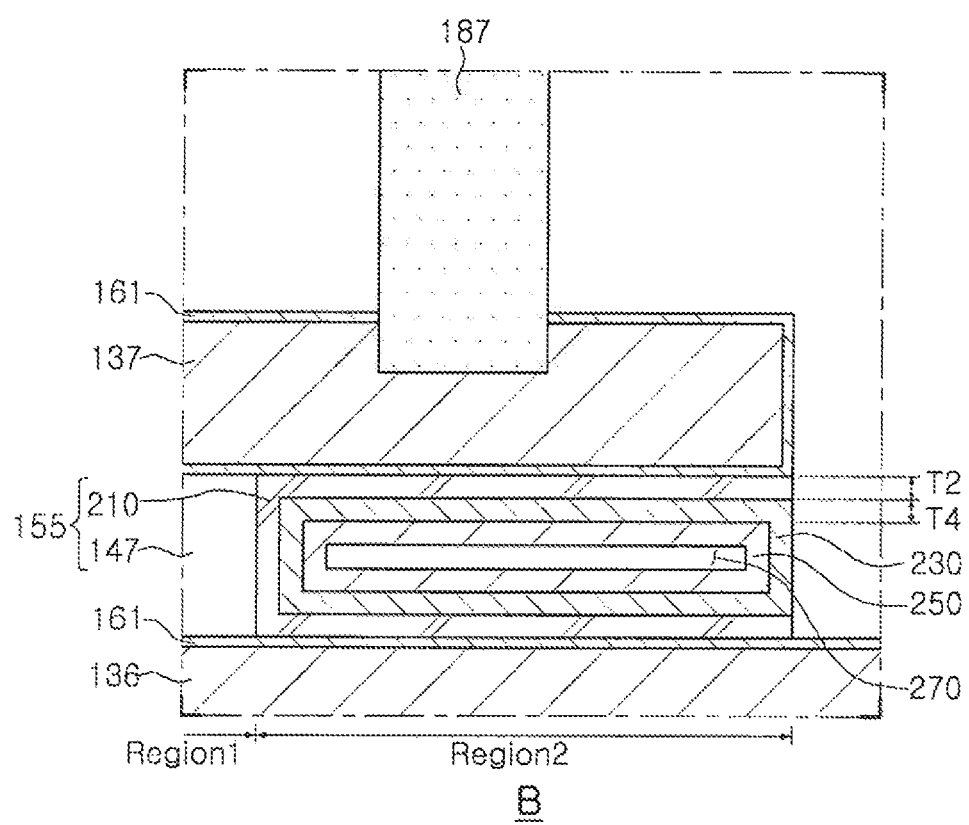

Referring to FIGS. 7 through 10, when a thickness T2 (T1>T2) of a deposited etching stop layer 210 is relatively small, the high-k dielectric material may flow into the air gap 270, and thus, the first filling layer 230 may be formed. In some embodiments, the amount of the high-k dielectric material may be adjusted to determine a thickness of the first filling layer 230. In some embodiments, the amount of the high-k dielectric material may be adjusted to be in or completely fill an interior of the etching stop layer 210 with the first filling layer 230, as illustrated in FIG. 7. In the example embodiment illustrated in FIG. 7, the thickness Tx of the first filling layer 230 may be less than two times the thickness Ty of the blocking layer 161. In addition, the amount of the high-k dielectric material may be adjusted to form the air gap 270 inside the first filling layer 230, as illustrated in FIGS. 8 and 10. When the air gap 270 is formed inside the first filling layer 230 and a sum (T2+T3) of the thickness T2 of the etching stop layer 210 and a thickness T3 of the first filling layer 230 is sufficiently large, the conductive material may not flow into the air gap 270. Thus, as illustrated in FIG. 8, the first filling layer 230 having the air gap 270 may ultimately be formed inside the etching stop layer 210. In some embodiments, when a sum (T2+T4) of the thickness T2 of the etching stop layer 210 and a thickness T4 (T3>T4) of the first filling layer 230 is relatively small, the conductive material may flow into the air gap 270 to form the second filling layer 250. In some embodiments, the amount of the conductive material may be adjusted to determine a thickness of the second filling layer 250. Depending on the amount of the conductive material, an interior of the first filling layer 230 may be completely filled with the second filling layer 250, as illustrated in FIG. 9, or the second filling layer 250 having the air gap 270 may also be formed inside the first filling layer 230, as illustrated in FIG. 10.

FIGS. 11 through 24 illustrate methods of manufacturing the memory device 100 according to an example embodiment of the present inventive concepts. FIG. 12 is a cross-sectional view taken along line I-I' of FIG. 11.

Figure 11:
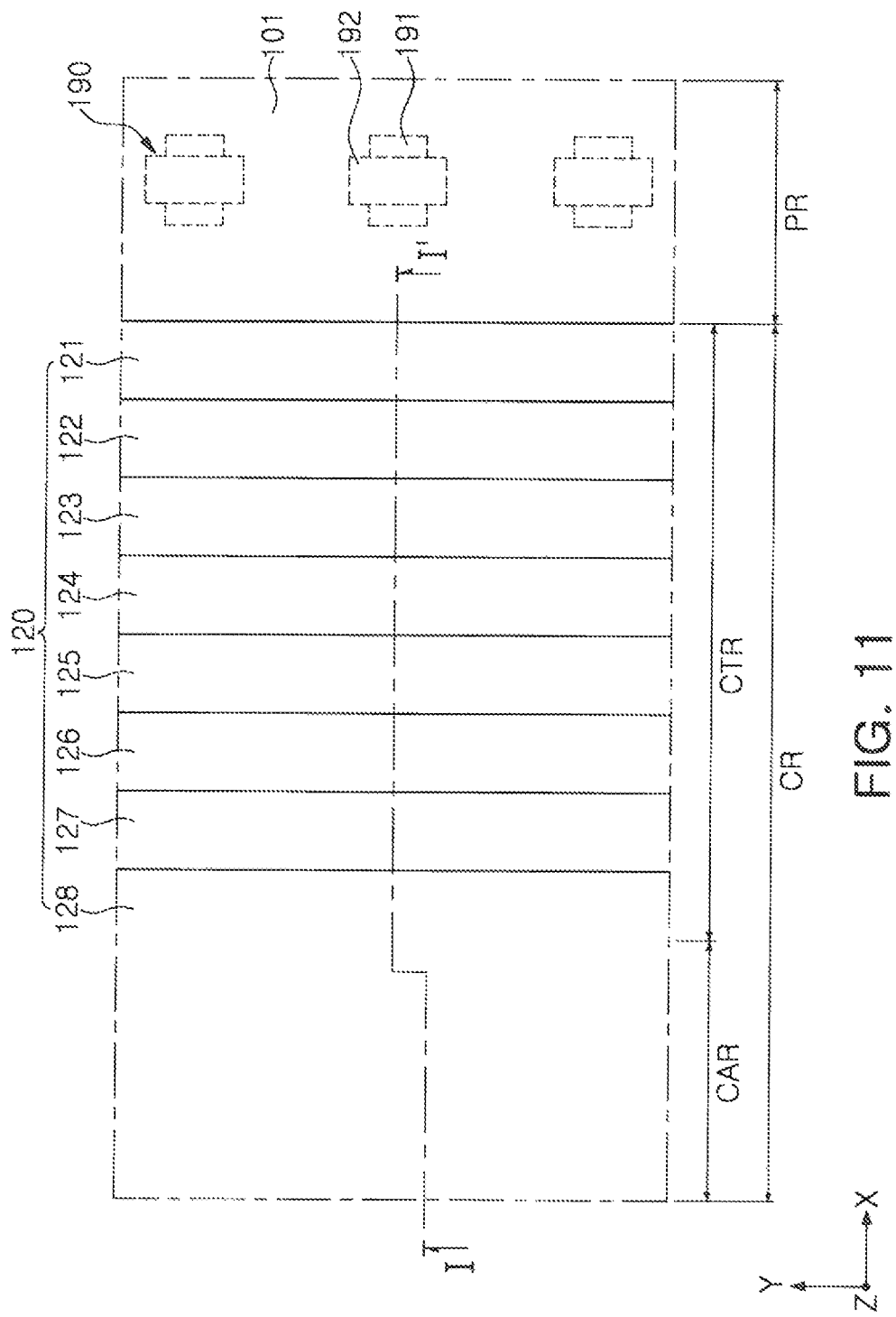
FIGS. 11 through 24 illustrate methods of manufacturing a memory device according to an example embodiment of the present inventive concepts.
Figure 12:
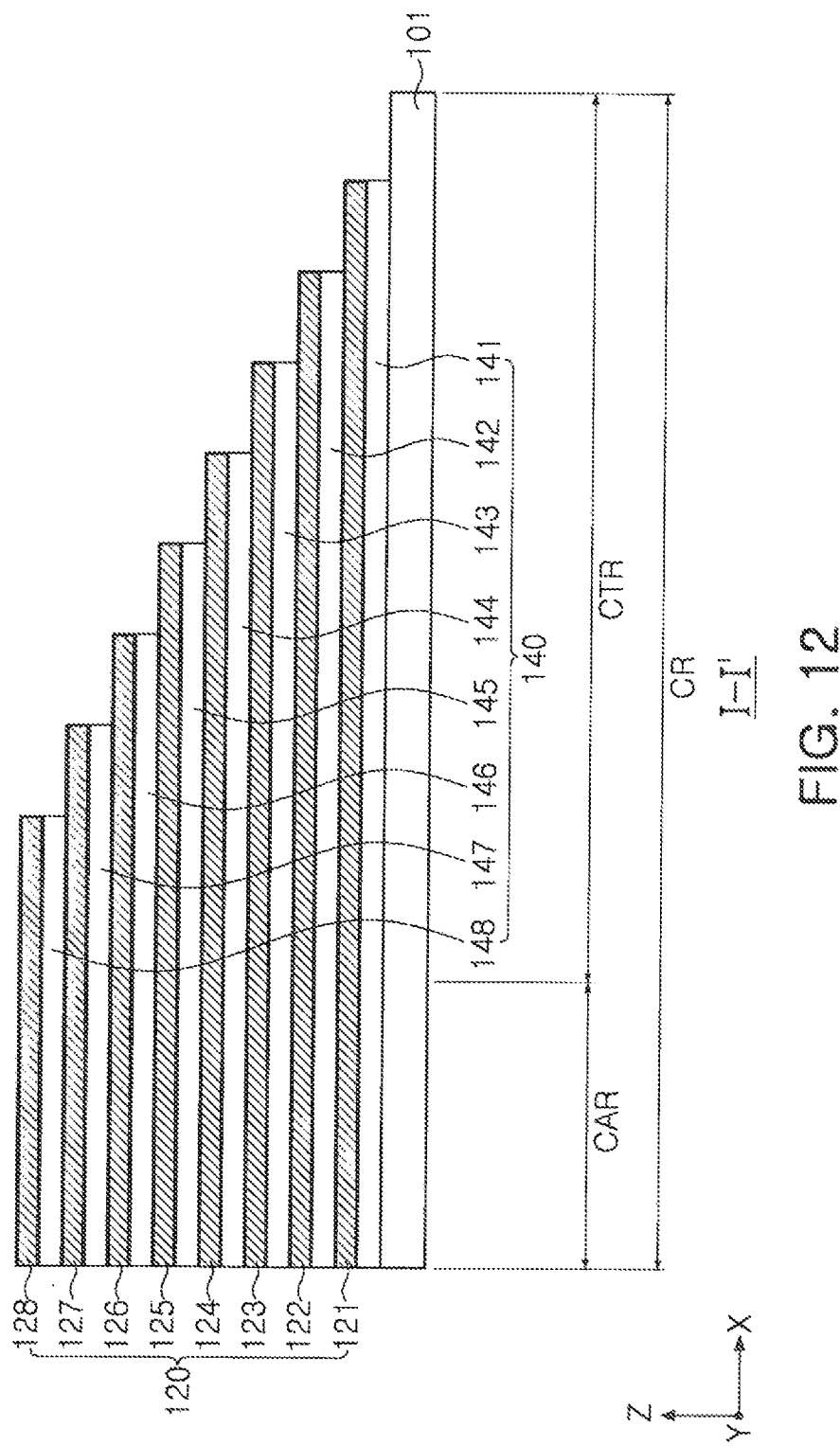

Referring to FIGS. 11 and 12, a plurality of first to eighth sacrificial layers 121 to 128 collectively represented by a sacrificial layer 120 and the first to eighth insulating layers 141 to 148 collectively represented by the insulating layer 140 may be alternately stacked on the upper surface of the substrate 101. Each of the first to eighth sacrificial layers 121 to 128 and each of the first to eighth insulating layers 141 to 148 adjacent thereto in the stacking direction, for example, in the Z-axis direction, may form a pair, and may extend in the first direction, for example, the X-axis direction. The pairs formed by the sacrificial layer 120 and the insulating layer 140 may extend to have different respective lengths in the first direction, thereby forming a stepped structure, as illustrated in FIGS. 11 and 12.

Referring to FIGS. 11 and 12, the pad region may be formed by the stepped structure. The formation of the pad region may allow at least a portion of one of the first to eighth sacrificial layer 121 to 128, disposed under another in the stacking direction, to be exposed externally. A mask layer may be formed on the first to eighth sacrificial layers 121 to 128 and the first to eighth insulating layers 141 to 148 alternately stacked on the substrate 101, and the exposed at least a portion of the sacrificial layer 120 and the insulating layer 140 may be etched, using the mask layer. A process of etching the exposed at least a portion of the sacrificial layer 120 and the insulating layer 140, using the mask layer, while trimming the mask layer, may be repeated to form the stepped structure, as illustrated in FIGS. 11 and 12. In some embodiments, the sacrificial layer 120 may be disposed on the insulating layer 140 in the pad region.

The sacrificial layer 120 and the insulating layer 140 may be formed of a material having a predetermined etch selectivity. Such etch selectivity may be quantitatively represented as a ratio of etching speed of the sacrificial layer 120 to that of the insulating layer 140. For example, the insulating layer 140 may include at least one of a silicon oxide layer and/or a silicon nitride layer, and the sacrificial layer 120 may include at least one of a silicon layer, a silicon oxide layer; a silicon carbide layer and/or a silicon nitride layer, different from the insulating layer 140. For example, when the insulating layer 140 includes a silicon oxide layer, the sacrificial layer 120 may include a silicon nitride layer.

FIG. 11 also illustrates that peripheral circuit region PR may include a peripheral circuit device 190 formed on the substrate 101. The peripheral circuit device 190 may be a planar transistor, and may include an active region 191 and a planar gate electrode 192. The peripheral circuit region PR is illustrated to show a layout of the peripheral circuit region PR, though it will be understood that the peripheral circuit device 190 illustrated within the peripheral circuit region PR may be formulated, before, after, or during the formulation of the cell region CR, as described herein. In some embodiments, the peripheral circuit device 190 in the peripheral circuit region PR may be omitted.

Figure 13:
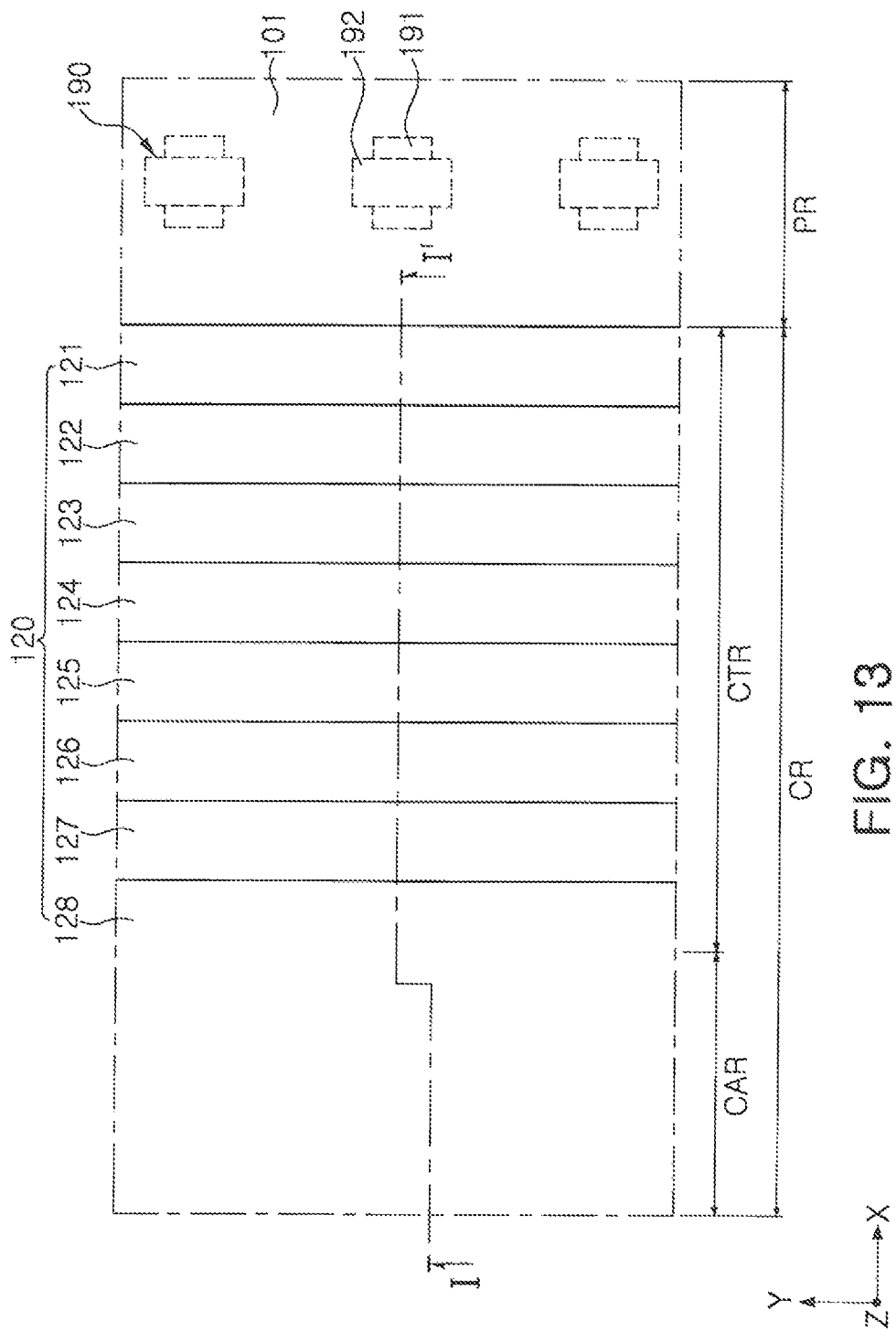
Figure 14:
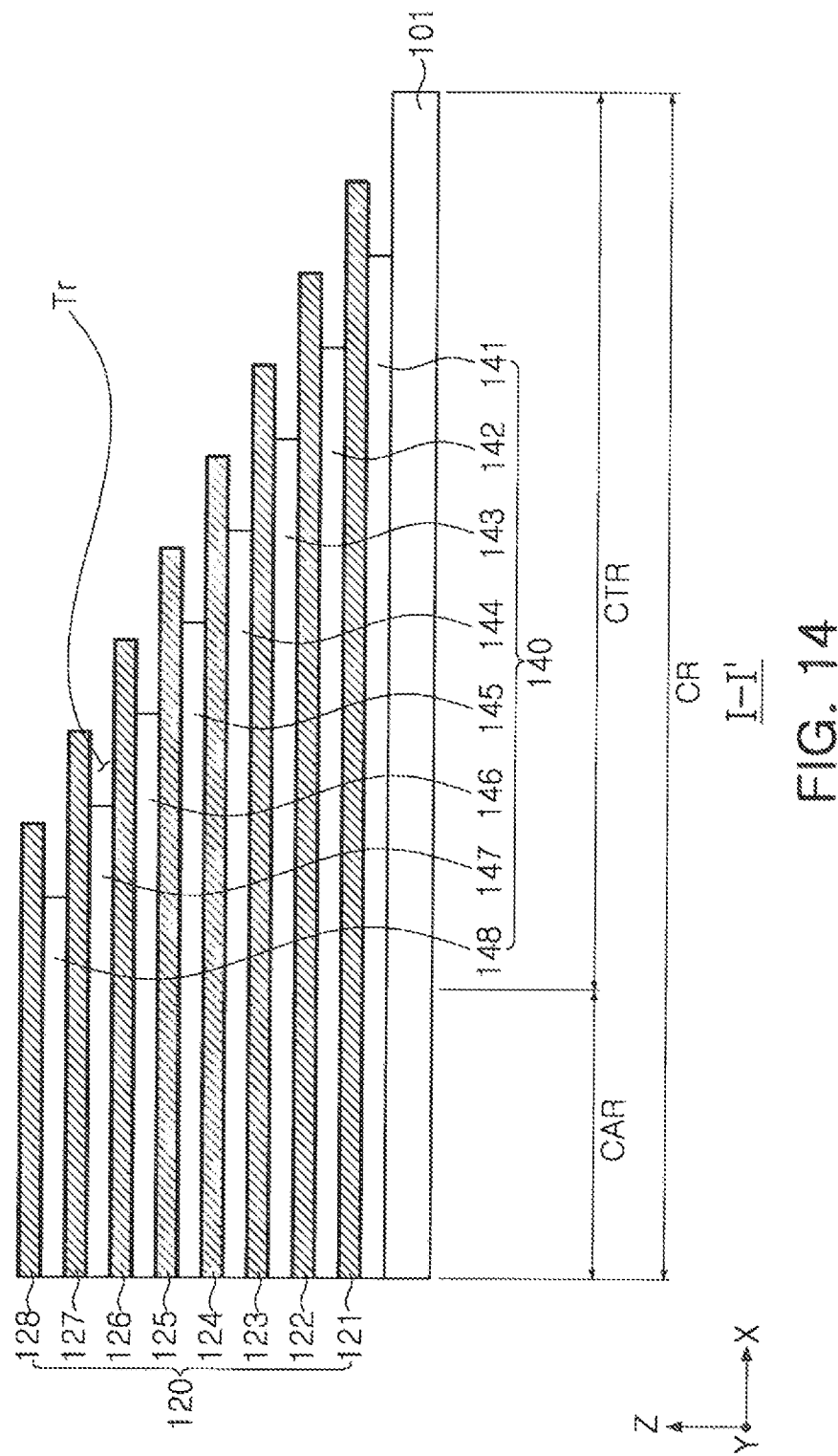

Referring to FIGS. 13 and 14, a portion of the insulating layer 140 disposed on the lower portion of the pad region may be recessed to form a plurality of trenches, collectively referred to as trench Tr. An etching solution may be allowed to flow to the stepped structure, composed of the insulating layer 140 and the sacrificial layer 120, through a lateral surface of the insulating layer 140 having a different length, so as to selectively remove the portion of the insulating layer 140 disposed on the lower portion of the pad region.

Figure 15:
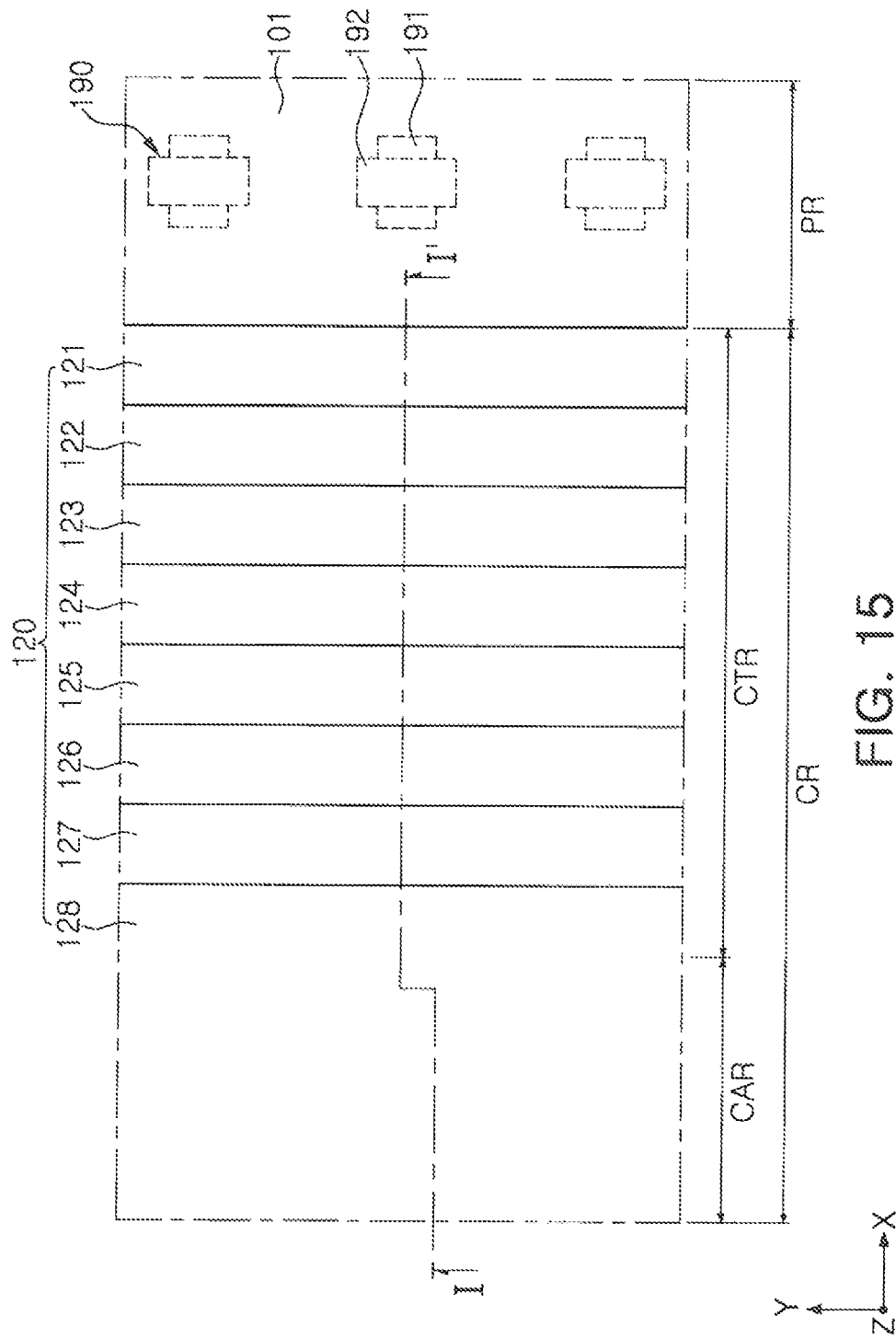
Figure 16:
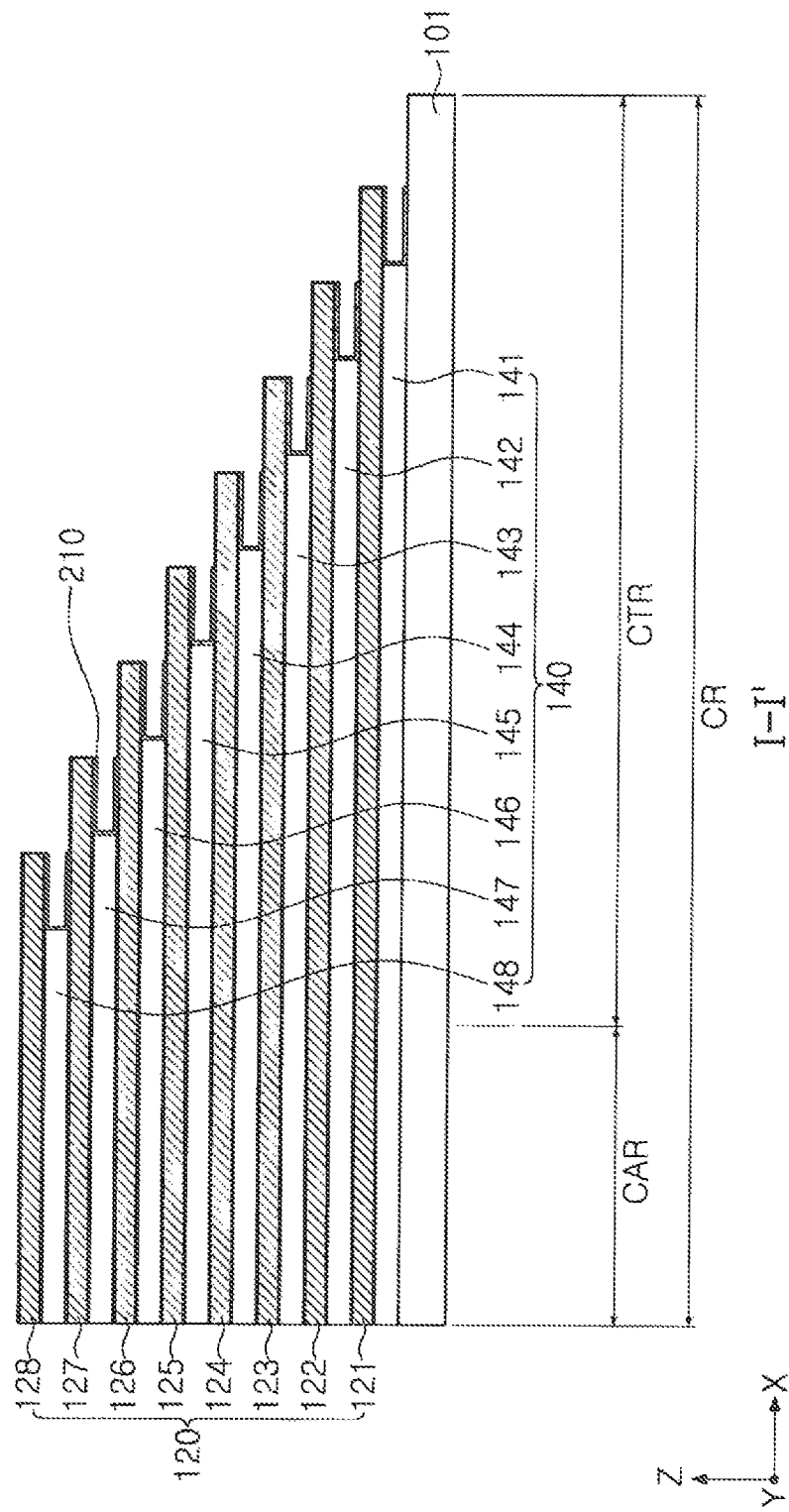

Referring to FIGS. 15 and 16, the etching stop layer 210 may be formed inside the trench Tr. The etching stop layer 210 may be formed enclosing a space therein along one lateral surface and upper and lower surfaces of the trench Tr, using an atomic layer deposition (ALD) or chemical vapor deposition (CVD) process. The etching stop layer 210 may be formed of, for example, a silicon carbon nitride (SiCN) and/or a silicon oxynitride (SiON).

Figure 17:
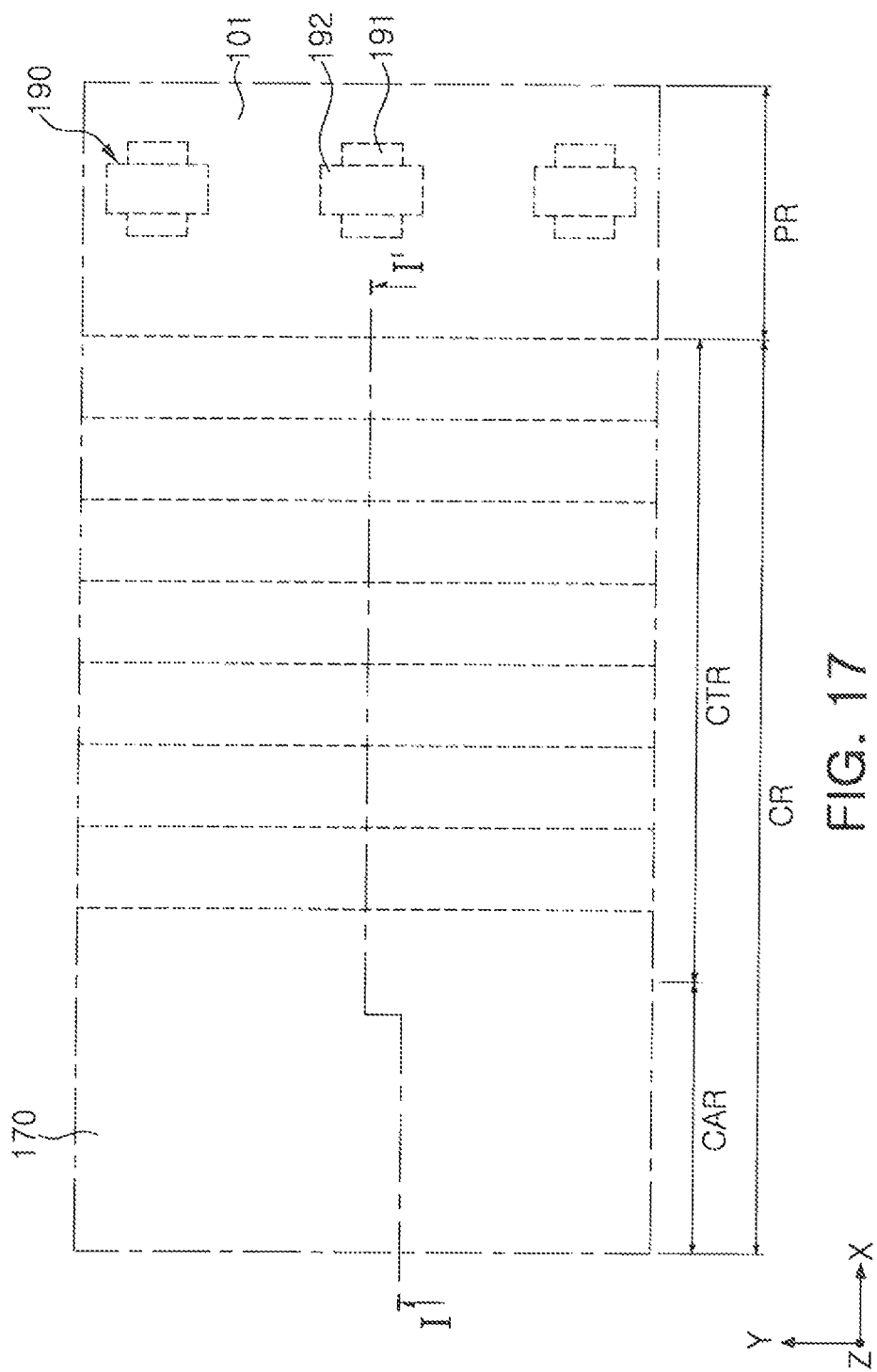
Figure 18:
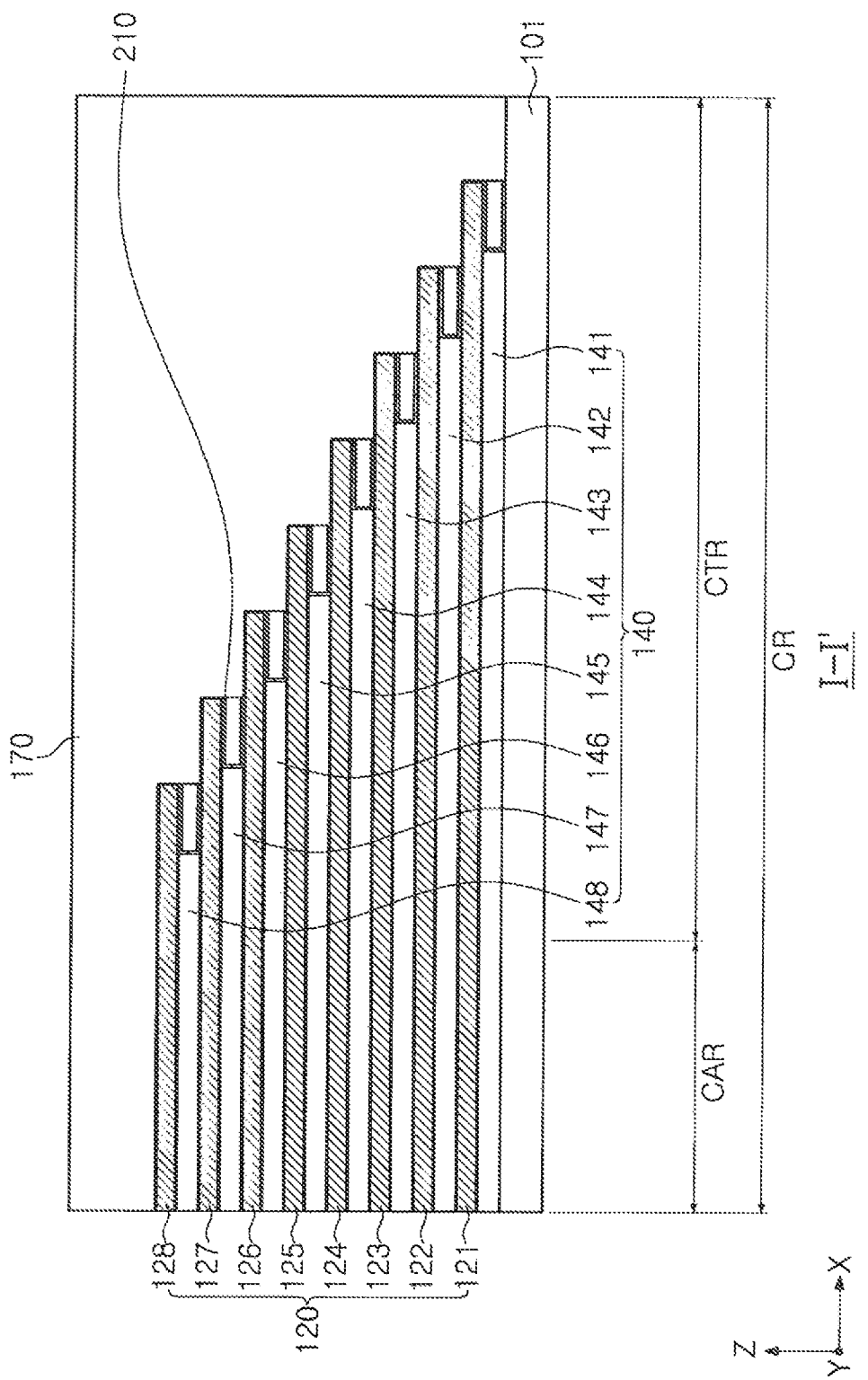

Referring to FIGS. 17 and 18, the interlayer insulating layer 170 may be formed on the sacrificial layer 120. In some embodiments, the interlayer insulating layer 170 may also extend to the peripheral circuit region PR to cover the peripheral circuit device 190. The interlayer insulating layer 170 may be formed of an oxide layer having a high deposition rate. Due to low gap filling properties of the interlayer insulating layer 170, the interlayer insulating layer 170 may not flow into the internal space of the etching stop layer 210, and an air gap may thus be formed between opposing surfaces of the etching stop layer 210. As an example, the interlayer insulating layer 170 may include an insulating material such as a silicon oxide, a high density plasma (HDP) oxide, and/or a tetraethyl orthosilicate (TEOS) oxide.

Figure 19:
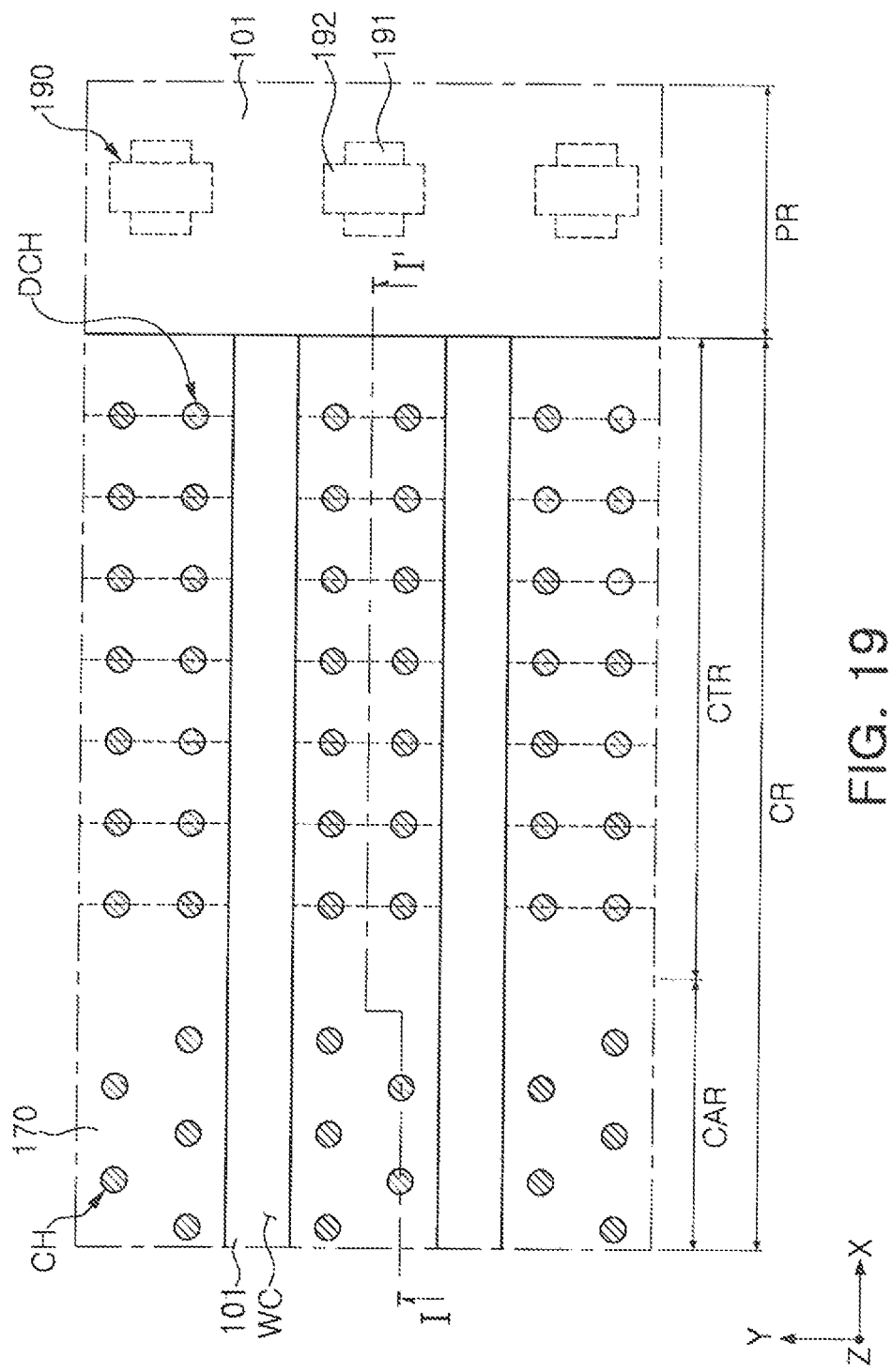
Figure 20:
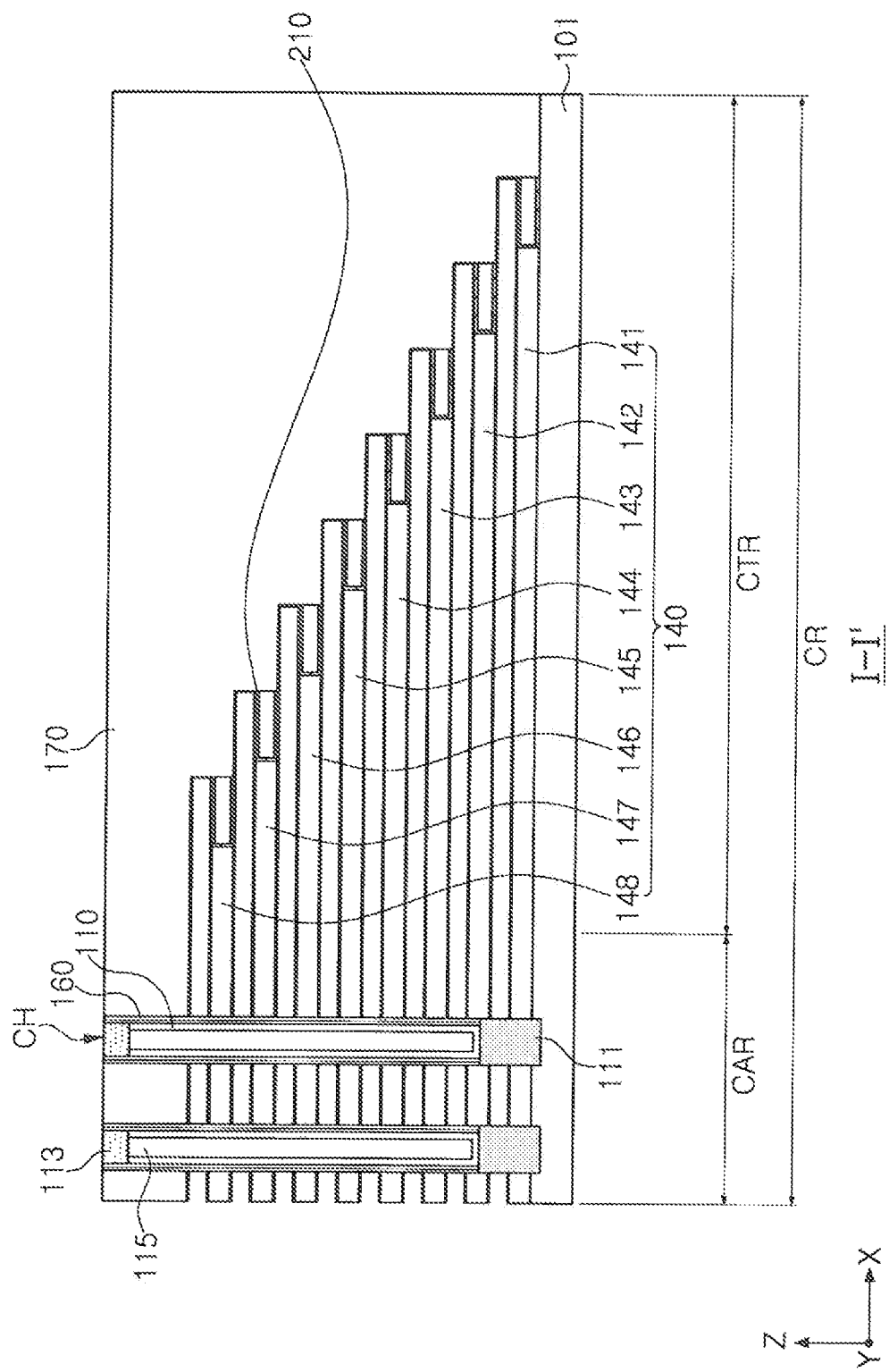

Referring to FIGS. 19 and 20, after the formation of the interlayer insulating layer 170, the channel structures CHs and DCHs passing through the sacrificial layer 120, the insulating layer 140, and the like, may be formed. The channel structures CHs and DCHs may include the channel structures CHs and the dummy channel structures DCHs.

A process of forming the channel structures CHs and DCHs may start from forming a plurality of channel holes. The channel hole may have a depth that passes through the sacrificial layer 120 and the insulating layer 140, and then penetrates into at least a portion of the substrate 101. The channel hole may be partially or completely filled with the gate insulating layer 160, the channel layer 110, and the filling insulating layer 115 in sequence, and the bit line pad 113 and the epitaxial layer 111 may be provided above and below the channel layer 110. The epitaxial layer 111 may be formed by applying a selective epitaxial growth (SEG) process to a portion of the substrate 101 exposed by the channel hole prior to filling the channel hole with the gate insulating layer 160, the channel layer 110, and the filling insulating layer 115. The gate insulating layer 160 may include the tunneling layer 163 and the charge storage layer 162 stacked sequentially from the channel layer 110.

A plurality of layers included in the gate insulating layer 160 may be formed, using an ALP or CVD process. The charge storage layer 162 and the tunneling layer 163 of the gate insulating layer 160 (see FIG. 5) may be stacked sequentially in a region adjacent to the sacrificial layer 120 and the insulating layer 140. The channel layer 110 may have a thickness within a range of $\frac{1}{50}$ to $\frac{1}{5}$ of a width of an opening of the channel hole. Similar to the gate insulating layer 160, the channel layer 110 may be formed, using an ALD or CVD process.

The internal space of the channel layer 110 may be partially or completely filled with the filling insulating layer 115. Prior to the formation of the filling insulating layer 115, a hydrogen annealing operation of thermally treating a structure in which the channel layer 110 is formed under a gas atmosphere including hydrogen and/or heavy hydrogen may be selectively further performed. The hydrogen annealing operation may correct crystal defects present in the channel layer 110. Subsequently, the bit line pad 113 may be formed of a conductive material such as polycrystalline silicon on the channel layer 110.

After the formation of the channel structures CHs and DCHs, a plurality of word line cuts WCs may be formed. A portion of the substrate 101 may be exposed by each of the word line cuts WCs, and the sacrificial layer 120 and the insulating layer 140 may be divided into a plurality of portions on the X-Y plane by the word line cuts WC. The word line cuts WC may allow an etching solution such as phosphoric acid (HP) or the like to flow through the word line cuts WC to leave the insulating layer 140 and selectively remove only the sacrificial layer 120.

Figure 21:
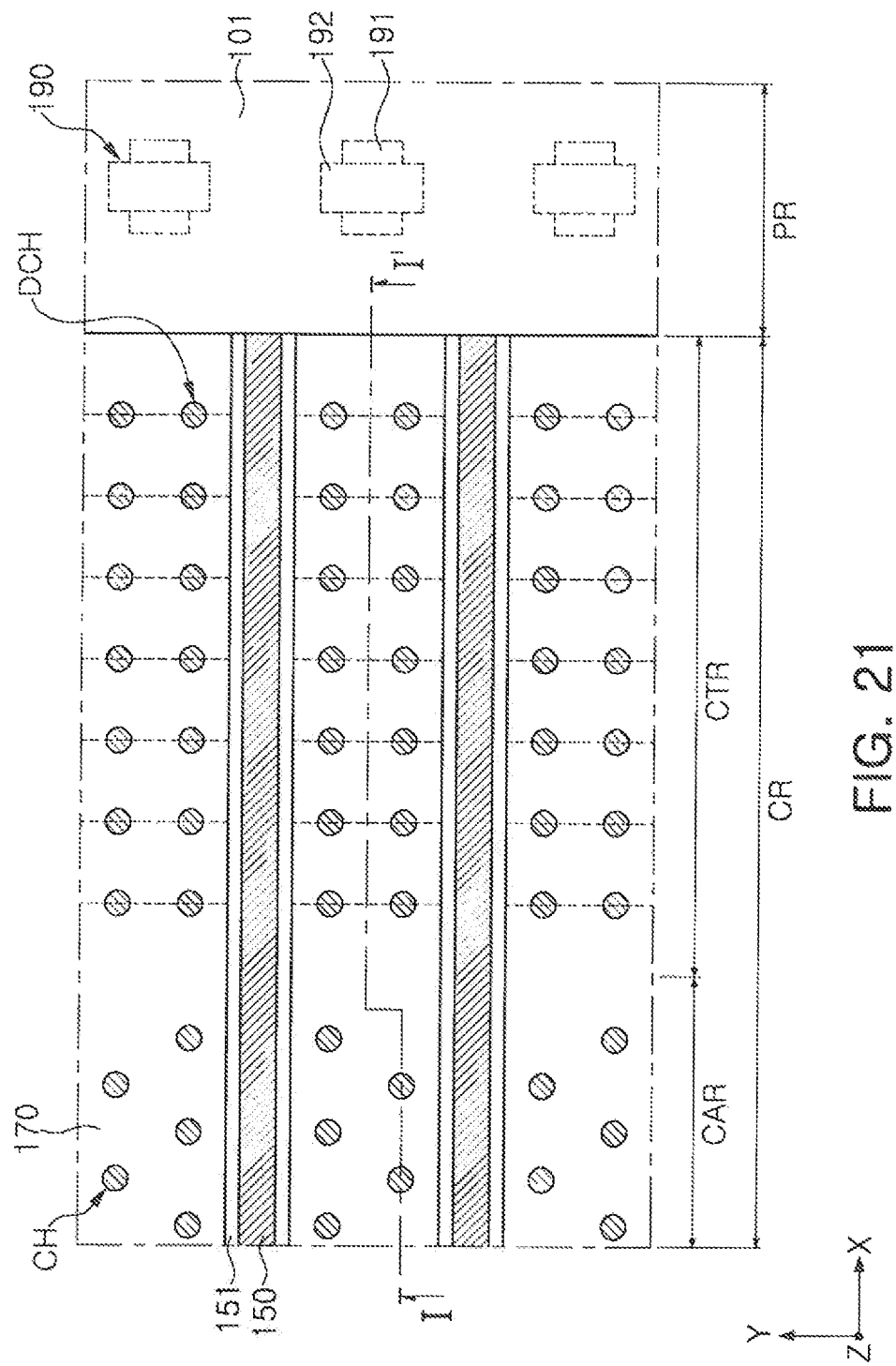
Figure 22:
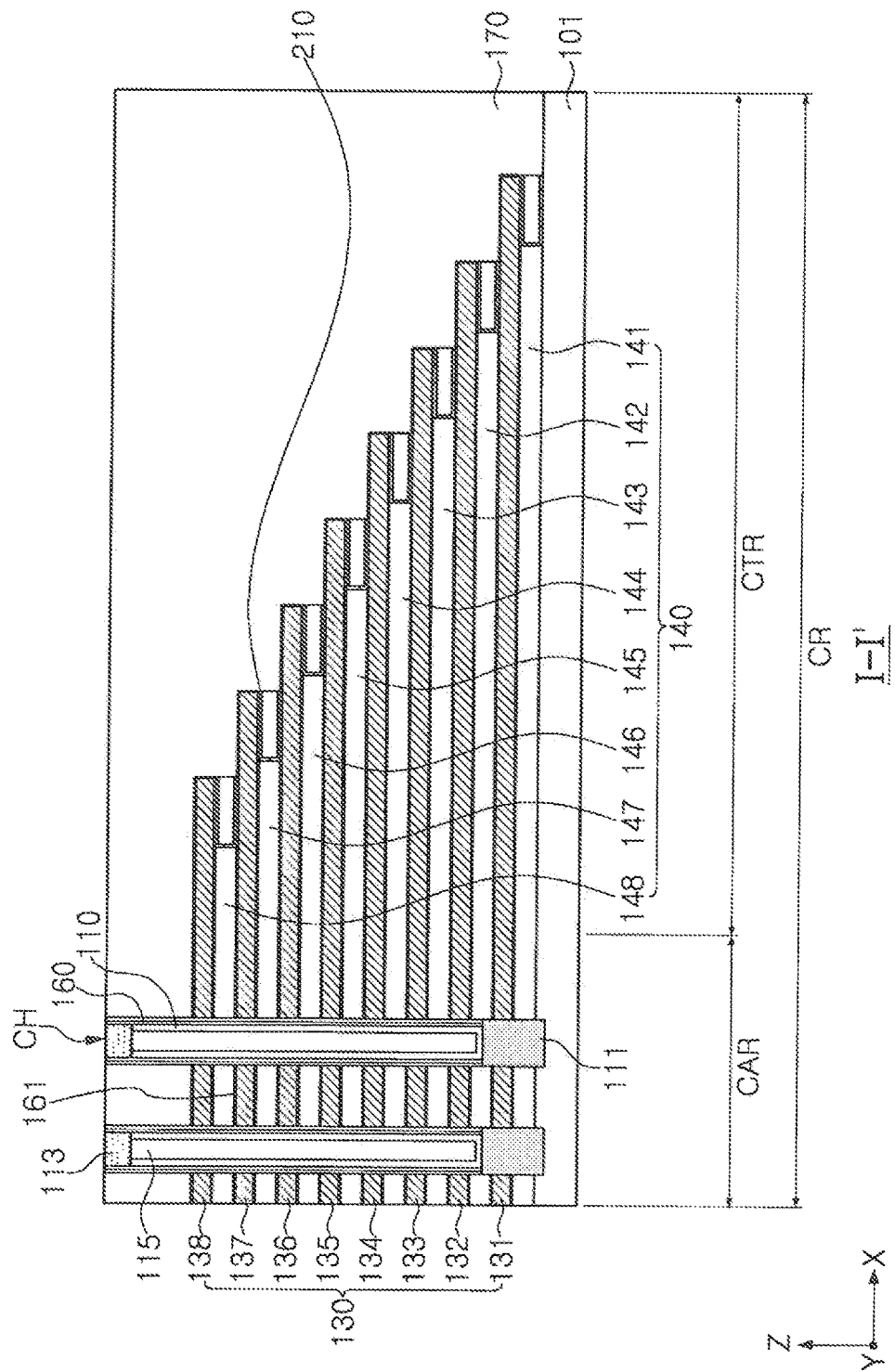

Referring to FIGS. 21 and 22, a high-k dielectric material and a conductive material may be allowed to flow through a space from which the sacrificial layer 120 has been removed, using the word line cut WC, to form the blocking layer 161 and the first to eighth gate electrode layers 131 to 138 (collectively represented by the gate electrode layer 130) formed therein. The blocking layer 161 may surround the gate electrode layer 130.

The high-k dielectric material and the conductive material may be allowed to flow into the air gap of the etching stop layer 210, as well as to the space from which the sacrificial layer 120 has been removed, using the word line cuts WCs. In some embodiments, depending on whether the high-k dielectric material and the conductive material have been allowed to flow into the air gap, the formation of at least one filling layer and/or air gap inside the etching stop layer 210 may be determined. In some embodiments, the at least one filling layer and the blocking layer 161 may include the same high-k dielectric material.

In some embodiments, whether to form the first filling layer 230, the second filling layer 250, and/or the air gap 270 may be determined based on a thickness of the formed etching stop layer 210 and amounts of the high-k dielectric material and the conductive material. Hereinafter, additionally referring to FIGS. 6 through 10, whether the high-k dielectric material and the conductive material may flow into the air gap will be described.

Referring to FIG. 6, when the thickness T1 of the deposited etching stop layer 210 is large, the high-k dielectric material may not flow into the air gap 270, and the etching stop layer 210 having the air gap 270 therein may thus be formed.

Referring to FIGS. 7 through 10, when the thickness T2 (T1>T2) of the deposited etching stop layer 210 is relatively small, the high-k dielectric material may flow into the air gap 270, and the first filling layer 230 may thus be formed. In some embodiments, the amount of the high-k dielectric material may be adjusted to determine the thickness of the first filling layer 230. In some embodiments, the amount of the high-k dielectric material may be adjusted to completely fill the interior of the etching stop layer 210 with the first filling layer 230, as illustrated in FIG. 7. In the example embodiment illustrated in FIG. 7, the thickness of the first filling layer 230 may be less than two times that of the blocking layer 161. In addition, the amount of the high-k dielectric material may be adjusted to form the air gap 270 inside the first filling layer 230, as illustrated in FIGS. 8 through 10. When the air gap 270 is formed inside the first filling layer 230 and the sum (T2+T3) of the thickness T2 of the etching stop layer 210 and the thickness T3 of the first filling layer 230 is sufficiently large, the conductive material may not flow into the air gap 270. Thus, as illustrated in FIG. 8, the first filling layer 230 having the air gap 270 may ultimately be formed inside the etching stop layer 210. In some embodiments, when the sum (T2+T4) of the thickness T2 of the etching stop layer 210 and the thickness T4 (T3>T4) of the first filling layer 230 is relatively small, the conductive material may flow into the air gap 270 to form the second filling layer 250. In some embodiments, the amount of the conductive material may be adjusted to determine the thickness of the second filling layer 250. Depending on the amount of the conductive material, the interior of the first filling layer 230 may be completely filled with the second filling layer 250, as illustrated in FIG. 9, or, in some embodiments, the second filling layer 250 having the air gap 270 therein may be formed inside the first filling layer 230, as illustrated in FIG. 10.

The above description describes the same configuration of components formed in the second region of the gate isolating layers 155. However, an amount of a material flowing into different trenches and different word line cuts WCs may be adjusted, and thus, the configurations of components formed in the second region of the gate isolating layers 155 in a single memory device 100 may be formed to have various shapes, as illustrated in FIGS. 6 through 10.

The high-k dielectric material may refer to a dielectric material having a higher dielectric constant than that of a silicon oxide layer. The conductive material may include a metal, polycrystalline silicon, and/or a metal silicide material. The metal silicide material may be a silicide material including at least one of, for example, cobalt (Co), nickel (Ni), hafnium (Hf), platinum (Pt), tungsten (W), and titanium (Ti), or combinations thereof. When the gate electrode layer 130 is formed of the metal silicide material, the gate electrode layer 130 may be formed by filling lateral openings thereof with silicon (Si), forming an additional metal layer, and performing a silicidation process. In some embodiments, the gate electrode layer 130 may also include a plurality of metal layers, and at least one thereof may be a work function metal layer.

After the formation of the blocking layer 161 and the gate electrode layer 130, the isolation insulating layer 151 may be formed on each of inner lateral surfaces of the word line cut WC, and the source region may be formed by injecting impurities into the portion of the substrate 101 exposed by the word line cut WC. The isolation insulating layer 151 may be formed by depositing an insulating material in the word line cut WC and removing the insulating material from a portion other than the inner lateral surface of the word line cut WC, using, for example, an anisotropic etching process. The source region may be formed by injecting impurities, using, for example, an ion implanting process. In some embodiments, the source region may include n-type impurities. The common source line 150 may be formed in an internal space of the isolation insulating layer 151. The common source line 150 may extend in the direction perpendicular to the substrate 101, for example, the Z-axis direction, and in the first direction, for example, the X-axis direction, in which the word line cut WC extends. The common source line 150 may be connected to the source region while being in direct contact therewith.

Figure 23:
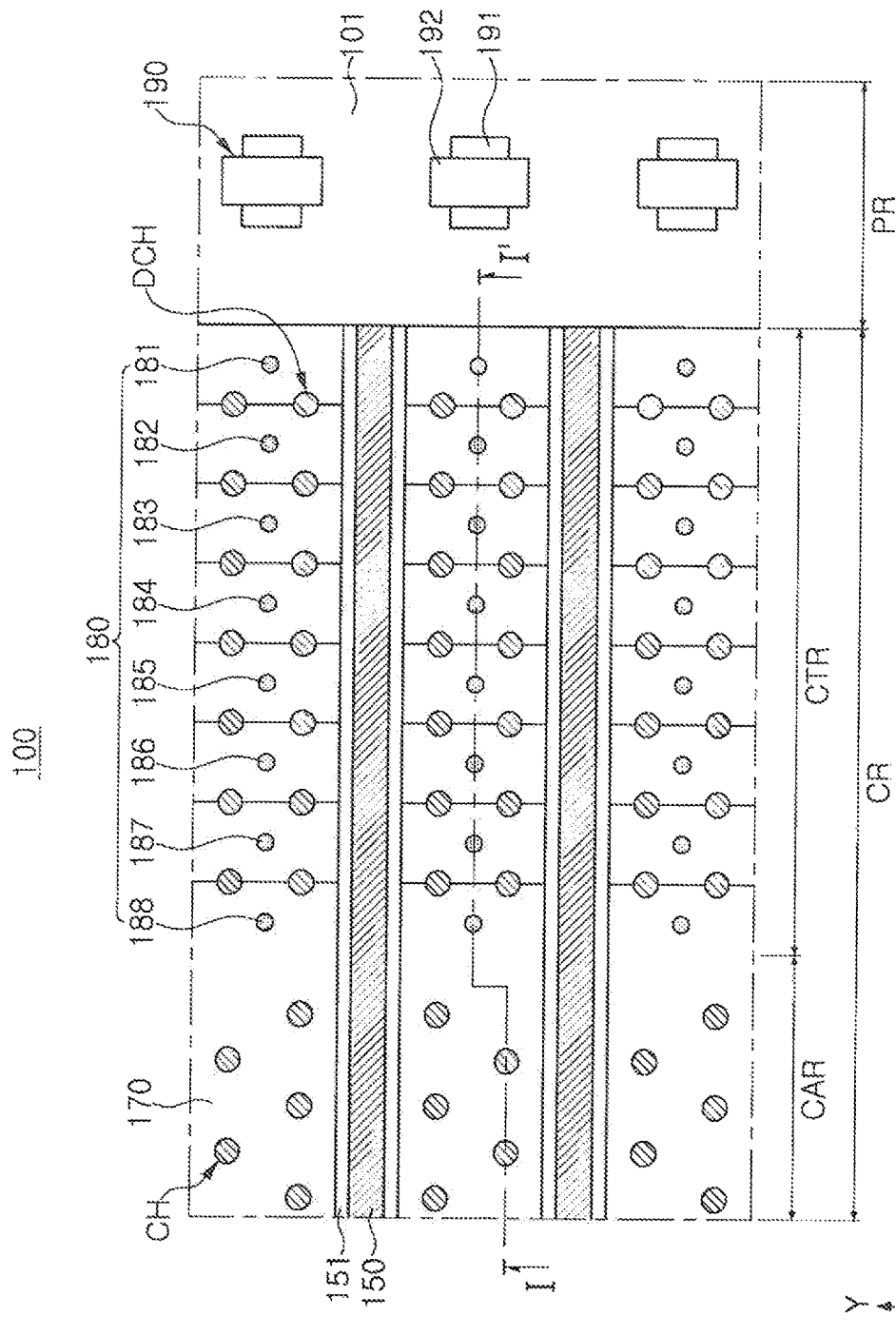
Figure 24:
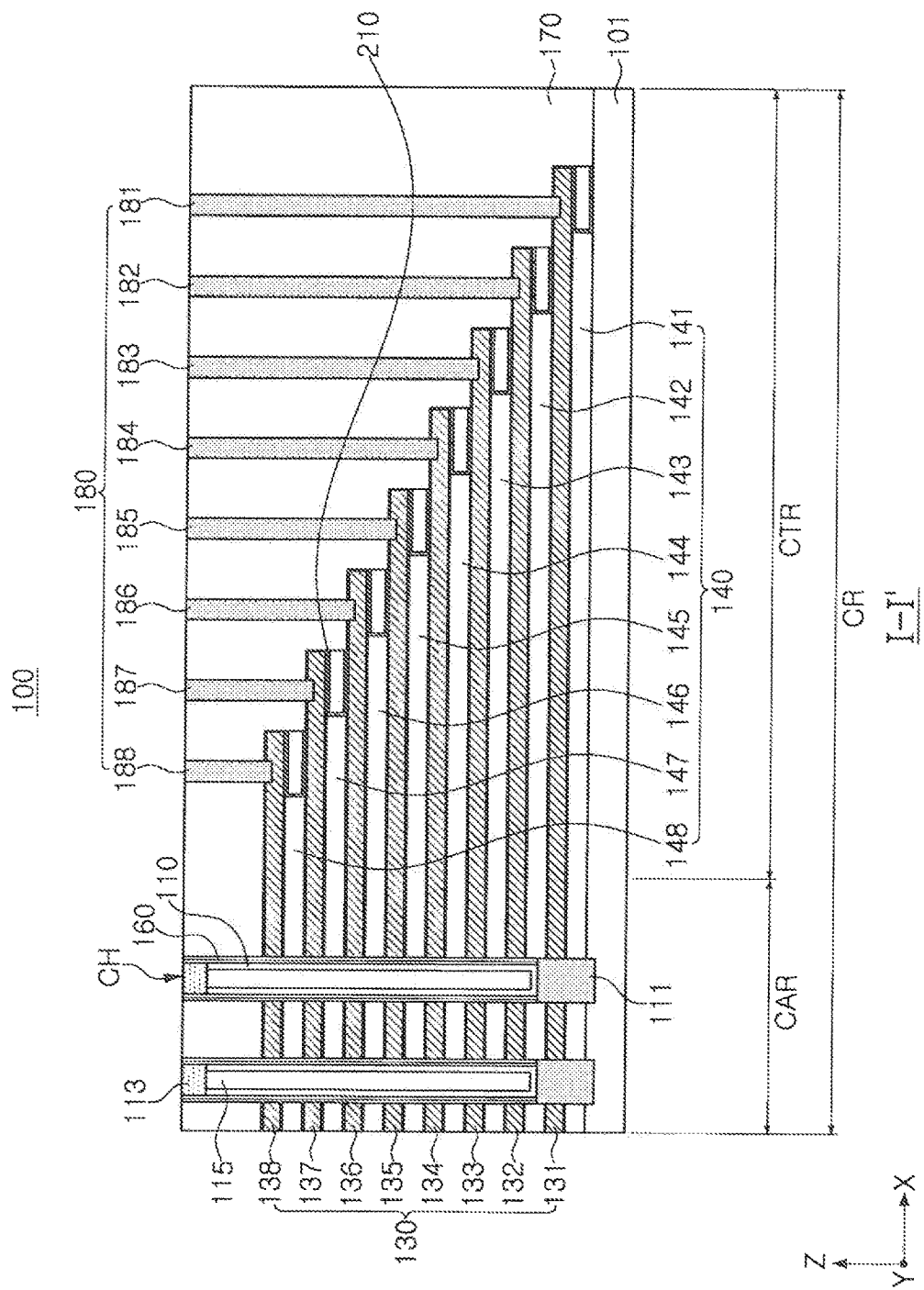

Referring to FIGS. 23 and 24, the first to eighth contacts 181 to 188 collectively represented by the contact 180 may be formed. The contact 180 may be formed by forming a plurality of contact holes passing through the interlayer insulating layer 170 in the pad region and filling the contact holes with a conductive material such as, for example, a metal. The contact hole may penetrate into at least a portion of the gate electrode layer 130.

In some embodiments, the etching stop layer 210 having at least one of an air gap 270 and/or at least one filling layer (e.g., 230 and/or 250) formed therein may be provided on the lower portion of the pad region in which the contact 180 may be connected to the gate electrode layer 130. Short circuits may be less likely to occur where a portion of the contact 180 is connected to two or more of the gate electrode layer 130. As a result, reliability of the memory device 100 may be increased. Furthermore, a larger amount of first to eighth gate electrode layers 131 to 138 having a reduced thickness may be stacked in the stacking direction, and thus, a degree of integration of the memory devices 100 may be higher.

Figure 25:
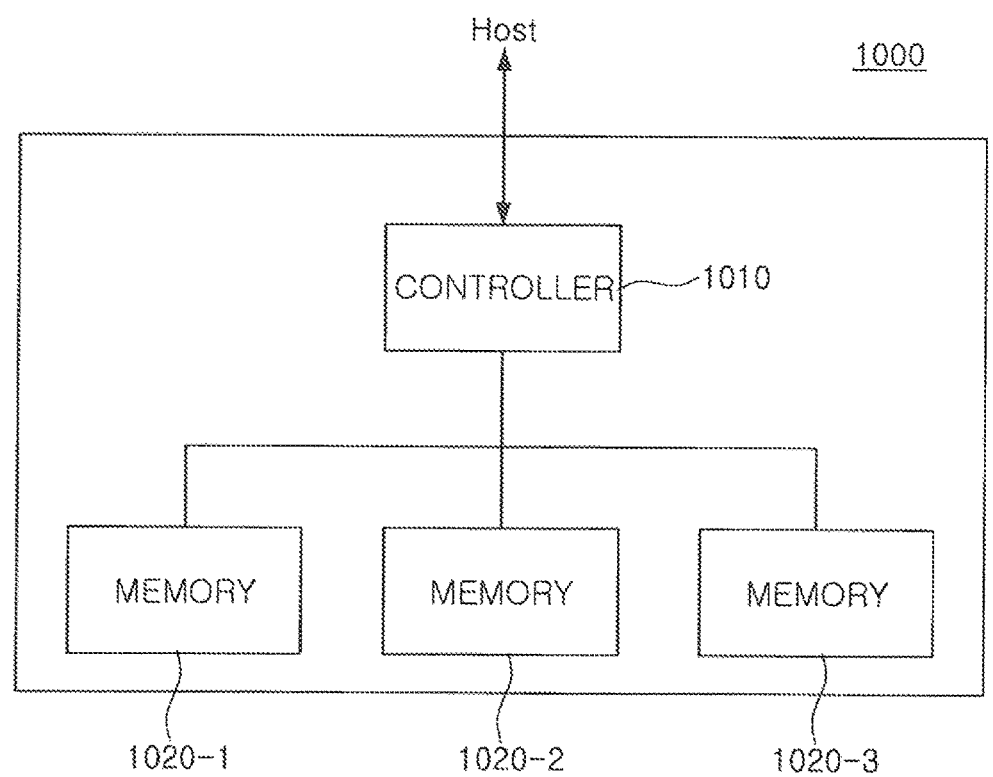
FIG. 25 illustrates a block diagram of an electronic device including a memory device according to an example embodiment of the present inventive concepts.

FIG. 25 is a block diagram of an electronic device including the memory device according to an example embodiment of the present inventive concepts.

Referring to FIG. 25, a storage device 1000 according to an example embodiment may include a controller 1010 communicating with a host and memories 1020-1, 1020-2, and 1020-3 storing data. The respective memories 1020-1, 1020-2, and 1020-3 may include the memory device 100 according to various example embodiments described above.

The host communicating with the controller 1010 may be various types of an electronic device to which the storage device 1000 is mounted, and may be, for example, a smartphone, a digital camera, a desktop computer, a laptop computer, a media player, or the like. The controller 1010 may receive a data writing or data reading request transferred by the host to enable data to be written to the memories 1020-1, 1020-2, and 1020-3 and/or may generate a command to allow data to be read from the memories 1020-1, 1020-2, and 1020-3.

As illustrated in FIG. 25, one or more memories 10204, 1020-2, and 1020-3 may be connected to the controller 1010 in parallel within the storage device 1000. By connecting the plurality of memories 1020-1, 1020-2, and 1020-3 to the controller 1010 in parallel, the storage device 1000 having a large capacity may be implemented, such as a solid state drive (SSD).

As set forth above, according to example embodiments of the present inventive concepts, an etching stop layer having at least one of an air gap and at least one filling layer formed therein may be provided on a lower portion of a pad region in which contacts are connected to gate electrode layers. Thus, an increase in a degree of integration of the memory devices may increase the number of gate electrode layers. When a thickness of one of the gate electrode layers is reduced, short circuits that may occur when the contacts pass the gate electrode layers may be inhibited or prevented. When a voltage is applied to the gate electrode layers through the contacts, metal atoms included in the gate electrode layers may be prevented or inhibited from diffusing through insulating layers. As a result, a memory device having improved reliability and an increased degree of integration may be provided.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, them are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While exemplary embodiments have been shown and described above, it will be apparent to those skilled in the art that modifications and variations could be made without departing from the scope of the present inventive concepts, as defined by the appended claims.

What is claimed is:

1. A memory device comprising:
    a gate structure including a plurality of gate electrode layers and a plurality of insulating layers alternately stacked on a substrate;
    a plurality of etching stop layers, extending from the insulating layers respectively, being on respective lower portions of the gate electrode layers; and
    a plurality of contacts connected to the gate electrode layers above upper portions of the etching stop layers, respectively,
    wherein respective ones of the etching stop layers comprise an air gap therein.

2. The memory device as claimed in claim 1, wherein respective ones of the etching stop layers comprise a lateral surface contacting respective ones of the insulating layers and an upper surface and a lower surface extending from the lateral surface.

3. The memory device as claimed in claim 1, wherein the etching stop layers are formed of silicon carbon nitride (SiCN) and/or silicon oxynitride (SiON).

4. The memory device as claimed in claim 1, further comprising: a filling layer in at least a portion of the etching stop layers.

5. The memory device as claimed in claim 4, wherein the air gap is formed in the filling layer.

6. The memory device as claimed in claim 4, wherein the filling layer comprises a high-k dielectric material.

7. The memory device as claimed in claim 4, wherein the filling layer comprises a plurality of layers formed of different materials, at least one of the plurality of layers comprising a conductive material.

8. The memory device as claimed in claim 1, further comprising a plurality of channel structures passing through the gate structure and extending in a direction substantially perpendicular to an upper surface of the substrate.

9. The memory device as claimed in claim 1, wherein a portion of one of the plurality of etching stop layers comes in contact with at least one of the contacts.

10. A memory device comprising:
    a plurality of gate electrode layers having a pad region connected to respective ones of a plurality of contacts; and
    a plurality of gate isolating layers alternately stacked with the gate electrode layers, and comprising a first region and a second region formed of different materials, respectively,
    wherein the second region of respective ones of the gate isolating layers is on a lower portion of the pad region of respective ones of the gate electrode layers, and comprises a plurality of layers formed of different materials under the respective ones of the gate electrode layers.

11. The memory device as claimed in claim 10, wherein the plurality of layers comprise:
    an etching stop layer on a lateral surface of the second region contacting the first region and on an upper surface and a lower surface of the second region; and
    at least one filling layer inside the etching stop layer.

12. The memory device as claimed in claim 11, wherein the etching stop layer comprises silicon carbon nitride (SiCN) and/or silicon oxynitride (SiON).

13. The memory device as claimed in claim 11, wherein the at least one filling layer comprises a high-k dielectric material.

14. The memory device as claimed in claim 13, further comprising:
blocking layers surrounding the plurality of gate electrode layers, respectively,
wherein the at least one filling layer comprises the same high-k dielectric material as the blocking layers.

15. The memory device as claimed in claim 11, wherein an interior of the etching stop layer is filled with the at least one filling layer.

16. A memory device comprising:
a substrate;
a gate electrode layer on the substrate and extending in a first direction substantially parallel to an upper surface of the substrate;
a contact on the gate electrode layer and extending in a second direction crossing the first direction, wherein the contact penetrates into at least a portion of the gate electrode layer;
an insulating layer adjacent the gate electrode layer and between the gate electrode layer and the substrate; and
an etching stop layer adjacent the insulating layer and between the contact and the substrate,
wherein the etching stop layer comprises an upper segment and a lower segment,
wherein the upper segment is adjacent the gate electrode layer, and
wherein the lower segment is separated from the upper segment in the second direction.

17. The memory device as claimed in claim 16, further comprising at least one filling layer between the upper segment and the lower segment of the etching stop layer.

18. The memory device as claimed in claim 17, wherein the at least one filling layer comprises a first filling layer and a second filling layer, and
wherein the first filling layer comprises a first material different from a second material of the second filling layer.

19. The memory device as claimed in claim 18, wherein the first material is a high-k dielectric material, and
wherein the second material is a conductive material.

20. The memory device as claimed in claim 16, further comprising an air gap between the upper segment and the lower segment of the etching stop layer.

* * * * *